US008576100B2

(12) United States Patent
Imthurn et al.

(10) Patent No.: US 8,576,100 B2
(45) Date of Patent: Nov. 5, 2013

(54) PARALLEL ENTROPY ENCODER AND PARALLEL ENTROPY DECODER

(75) Inventors: Paul Daniel Imthurn, Santa Cruz, CA (US); Wei Cheng Joseph Ku, San Jose, CA (US)

(73) Assignee: Certicom Corp., Mississauga, Ontario (*) Notice: Subject to any disclaimer, the term of this patent is extended or adjusted under 35 U.S.C. 154(b) by 290 days.

(21) Appl. No.: 13/182,660

(22) Filed: Jul. 14, 2011

(65) Prior Publication Data
US 2012/0022861 A1 Jan. 26, 2012

Related U.S. Application Data

(60) Provisional application No. 61/364,378, filed on Jul. 14, 2010, provisional application No. 61/364,380, filed on Jul. 14, 2010, provisional application No. 61/364,384, filed on Jul. 14, 2010, provisional application No. 61/364,386, filed on Jul. 14, 2010, provisional application No. 61/364,389, filed on Jul. 14, 2010.

(51) Int. Cl.
*H03M 7/00* (2006.01)

(52) U.S. Cl.
USPC ............................................. 341/107

(58) Field of Classification Search
USPC .................................. 341/51, 107
See application file for complete search history.

(56) References Cited

U.S. PATENT DOCUMENTS

| 5,381,145 A * | 1/1995 | Allen et al. ............ 341/107 |
| 5,471,206 A * | 11/1995 | Allen et al. ............ 341/51 |
| 6,105,132 A | 8/2000 | Fritch |
| 6,195,024 B1 * | 2/2001 | Fallon ................ 341/51 |
| 6,309,424 B1 * | 10/2001 | Fallon ................ 341/51 |
| 6,647,388 B2 | 11/2003 | Numao |
| 7,395,345 B2 * | 7/2008 | Fallon ............... 709/231 |
| 8,174,414 B2 * | 5/2012 | Korodi et al. .......... 341/107 |
| 2006/0070114 A1 | 3/2006 | Wood |
| 2007/0073694 A1 | 3/2007 | Picault |

OTHER PUBLICATIONS

European Search Report dated Jul. 20, 2011. In correspondence application No. 11160321.3.
European Search Report dated Jun. 14, 2012, in corresponding EPO Application No. 11174064.3.

(Continued)

*Primary Examiner* — Khai M Nguyen
(74) *Attorney, Agent, or Firm* — Novak Druce Connolly Bove + Quigg LLP

(57) ABSTRACT

An entropy encoder block for use in a context adaptive encoder and an entropy decoder block for use in a context adaptive decoder is presented. The encoder block includes a plurality of encoding elements, for processing encoding search tree look tables corresponding to encoding probabilities used by the context adaptive encoder, at least two of the encoding elements servicing the same probability. In an embodiment, at least one of the encoding search tree lookup tables comprises a set of shared encoding search tree lookup tables, accessible by at least two of the encoding elements. The decoder block includes a plurality of decoding elements, for processing decoding search tree lookup tables corresponding to the decoding probabilities used by the context adaptive decoder, at least two of the decoding elements servicing the same probability. In an embodiment, at least one of the decoding search tree lookup tables comprises a set of shared decoding search tree lookup tables, accessible by at least two of the decoding elements.

26 Claims, 17 Drawing Sheets

(56) References Cited

OTHER PUBLICATIONS

David Salomon: "Data Compression: The Complete Reference, 3rd Edition," 2007, Springer Verlag, XP002676278, p. 77; pp. 89-95, pp. 706-718.

Extended European Search report mailed Jun. 14, 2012, in corresponding European patent application No. 11174064.3.

David Salomon: "Data Compression: The Compete Reference, 3rd Edition", 2007, Springer Verlag, XP002676278, p. 77; p. 89-p. 95; p. 706-p. 718.

* cited by examiner

PARALLEL ENTROPY ENCODER AND PARALLEL ENTROPY DECODER

CROSS-REFERENCE TO RELATED APPLICATIONS

This application claims priority to U.S. Provisional Application Nos. 61/364,378; 61/364,380; 61/364,384; 61/364,386; and 61/364,389 each filed on 14 Jul. 2010, the entirety of said applications is incorporated herein by reference.

FIELD

The present application generally relates to data compression and, in particular, to a parallel implementation of an entropy encoder and an entropy decoder.

BACKGROUND

Data compression, whether lossy or lossless, often uses entropy coding to encode a decorrelated signal as a sequence of bits, i.e. a bitstream. Efficient data compression has a wide range of applications, such as data, image, audio, and video encoding. By way of example, ITU-T H.264/MPEG AVC is a video coding standard widely used for encoding/decoding video. It defines a number of different profiles for different applications, including the Main profile, Baseline profile and others.

There are a number of standards for encoding/decoding images and videos, including H.264, that employ lossy compression processes to produce binary data. For example, H.264 includes a prediction operation to obtain residual data, followed by a DCT transform and quantization of the DCT coefficients. The resulting data, including quantized coefficients, motion vectors, coding mode, and other related data, is then entropy coded to generate a bitstream of data for transmission or storage on a computer-readable medium.

A number of coding schemes have been developed to encode binary data. For example, JPEG images may be encoded using Huffman codes. The H.264 standard allows for two possible entropy coding processes: Context Adaptive Variable Length Coding (CAVLC) or Context Adaptive Binary Arithmetic Coding (CABAC). CABAC results in greater compression than CAVLC, but CABAC is more computationally demanding.

An entropy encoder/decoder is a component within a compression encoder/decoder. While the entropy encoder/decoder consumes only a small portion of the overall compression encoder/decoder, it can present a significant bottleneck in real-time compression because of the serial nature of its operation.

It would be advantageous to provide for an improved implementation of an entropy encoder and an entropy decoder.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
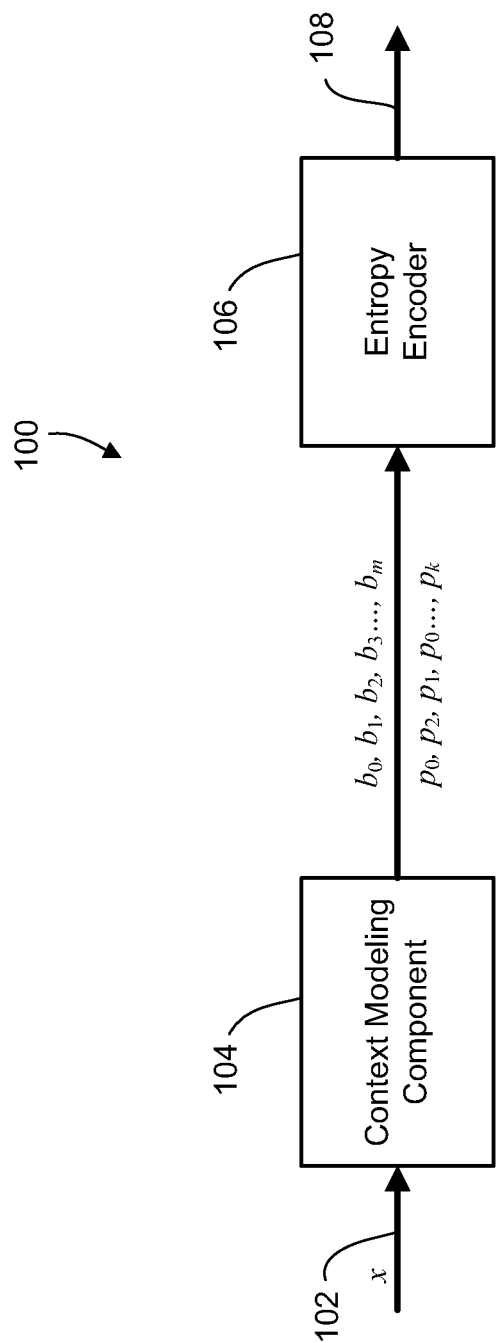
FIG. 1 shows, a block diagram of an encoding process.

In one aspect, the present application describes a hardware implementation of a parallel entropy encoder and a parallel entropy decoder.

In an embodiment, an entropy encoder block for use in a context adaptive encoder is provided. The entropy encoder block for encoding phrase words into code words using encoding search tree lookup tables, each encoding search tree lookup table corresponding to one of N encoding probabilities used by a context modeling component of the context adaptive encoder, the entropy encoder block receiving phrase words and an associated probability corresponding to one of the N probabilities for each phrase word.

The entropy encoder block may comprise a plurality of encoding elements for receiving phrase words and an indication of the associated probability for each phrase word, the plurality of encoding elements each connected to and operative to access a subset of one or more of the encoding search tree lookup tables to select a corresponding encoding search tree lookup table associated with each probability, such that each of the N encoding probabilities are serviced by at least one of the plurality of encoding elements and at least one of the N encoding probabilities is serviced by two or more encoding elements, and to encode the received phrase words using the selected encoding search tree lookup table to generate output code words; and, a state machine for assigning the phrase words to a particular encoding element based upon the encoding search tree lookup tables connected to that encoding element and an availability of that encoding element.

In an aspect, the two or more encoding elements may be either each connected to their own copy of an encoding search tree lookup table, or all connected to a set of one or more shared encoding search tree lookup tables, to service the at least one of the N encoding probabilities.

In an aspect, the set of one or more shared encoding search tree lookup tables may further comprise an input encoding crossbar switch connected to the two or more encoding elements and the set of one or more shared encoding search tree lookup tables, the input encoding crossbar switch operative to enable a selecting one of the two or more encoding elements to select a different shared encoding search tree lookup table from the set of one or more shared encoding search tree lookup tables; and, an output encoding crossbar switch connected to the set of one or more shared search tree lookup tables and the two or more encoding elements, the output encoding crossbar switch operative to communicate values from the selected shared encoding search tree lookup table to the corresponding selecting one of the two or more encoding elements.

In an aspect, the entropy encoder block may comprise control logic for evaluating the code words generated by the plurality of encoding elements and outputting load balancing information associated with the code words. The control logic may comprise a counter and the load balancing information comprises a count of a number of code words associated with each probability. The control logic may be operative to evaluate the code words and divide the code words into work packages, such that the work packages each require approximately equivalent processing to decode or, each contain approximately the same number of code words. The control logic may be further operative to generate pointers to identify each work package and package the pointers in a header attached to a group of work packages.

In an aspect, each work package may comprise code words of the same associated probability. In an aspect, at least one work package may comprise code words of differing associated probabilities. The differing associated probabilities within at least one work package may be selected from a list maintained by the encoder block that identifies a group of associated probabilities serviceable by a single decoding element of a plurality of parallel decoding elements.

In an aspect, the load balancing information may comprise a pointer identifying the start of each code word within a collection of code words; or, a code word identifier inserted between groups of code words.

In an aspect of the encoder block the state machine may be further operative to use load balancing information to assign the phrase words and the associated probability to a particular encoding element based upon the encoding search tree lookup tables connected to that encoding element and an availability of that encoding element.

The load balancing information may comprise either a list of encoding elements able to service each probability, and the state machine is further operative to match each of the phrase words with the first available encoding element from the list corresponding to that phrase word's associated probability; or, for each probability, a likelihood of occurrence for that probability, and the state machine is further operative to assign the phrase words to available encoding elements in a decreasing order of likelihood. The likelihood for each probability may further comprise identification of encoding elements able to service that probability, and the state machine is further operative to assign each phrase word to a one of the available encoding elements.

In an embodiment, an entropy decoder block for use in a context adaptive decoder may be provided. The entropy decoder block for decoding code words into phrase words using decoding search tree lookup tables, each decoding search tree lookup table corresponding to one of N encoding probabilities used by a context modeling component of the context adaptive decoder, the entropy decoder block receiving code words and, for each code word, an associated probability corresponding to one of the N probabilities. The entropy decoder block may comprise a plurality of decoding elements for receiving, code words and an indication of the associated probability for each code word, the plurality of decoding elements each connected to and operative to access a subset of one or more of the decoding search tree lookup tables such that each of the N decoding probabilities are serviced by at least one of the plurality of decoding elements and at least one of the N decoding probabilities is serviced by two or more decoding elements, and to decode the received code words using the accessed decoding search tree lookup table; and, a state machine for assigning each code word and the respective indication of the associated probability for that code word to a particular decoding element based upon the decoding search tree lookup tables connected to that decoding element and an availability of that decoding element.

In an aspect, the two or more decoding elements may be either each connected to their own copy of a decoding search tree lookup table, or all connected to a set of one or more shared decoding search tree lookup tables, to service the at least one of the N encoding probabilities. The set of shared decoding search tree lookup tables may further comprise an input decoding crossbar switch connected to the two or more decoding elements and the set of one or more shared decoding search tree lookup tables, the input decoding crossbar switch operative to enable a selecting one of the two or more decoding elements to select a different shared decoding search tree lookup table from the set of one or more shared decoding search tree lookup tables; and, an output decoding crossbar switch connected to the set of one or more shared search tree lookup tables and the two or more decoding elements, the output decoding crossbar switch operative to communicate values from the selected shared decoding search tree lookup tables to the corresponding selecting one of the two or more decoding elements.

In an aspect of the entropy decoder block the state machine may be operative to assign the code words and the respective indication of the associated probability for each code word using load balancing information to a particular decoding element based upon the decoding search tree lookup tables connected to that decoding element and an availability of that decoding element. The load balancing information may comprise, for each code word, a likelihood of the associated probability and the state machine is further operative to assign the code words to available encoding elements in decreasing order of likelihood of the associated probability for each code word. The state machine may be further operative to generate the load balancing information. The state machine may be further operative to generate the load balancing information as an estimate of the processing required to process each code word and to assign that code word to an available decoding element able to service the associated probability based upon that estimate. The decoder block may be further operative to compute the estimate from a number of code words associated with each probability.

In an aspect, the estimate may comprise a number of code words associated with each probability and the state machine is further operative to assign code words of each probability to decoding elements in decreasing order of the number of code words associated with that probability.

In an aspect, the state machine may be operative to receive the load balancing information. The load balancing information may comprise work package identifiers received with the code words and associated probabilities, the work package identifiers dividing the received code words into groups of code words, each group requiring approximately equal processing work by a decoding element to decode or comprising a same number of code words, and the control logic is further operative to distribute the work packages to the decoding elements. The identifiers may comprise pointers to identify the beginning of each work package, and the control logic is operative to access a code word buffer using the pointers to locate each work package.

The parallel entropy encoder and decoder described within is intended for use within a data compression and decompression scheme that employs a context based variable length coding scheme such as the Context Adaptive Variable Length Coding (CAVLC) process described in the H.264 standard, or other similar coding processes. For instance, the parallel entropy encoder and decoder could be used with the PARALLEL ENTROPY CODING AND DECODING METHODS AND DEVICES described in U.S. patent application Ser. No. 12/707,797 (incorporated herein by reference), and may be conveniently referred to as a Context-Based Adaptive Variable-length to Variable-length code (CAV2V) algorithm.

While examples are provided in this description with reference to the above CAVLC and CAV2V algorithms, it will be understood by the person of skill in the art that this is only an embodiment, and the entropy encoder and entropy decoder described herein may be more generally applied.

One of the techniques used in some entropy coding schemes, such as CAVLC and CABAC, both of which are used in H.264/AVC, is context modeling. With context modeling, each bit of the input sequence has a probability within a context, where the probability and the context is given by the bits that preceded it. In a first-order context model, the context may depend entirely upon the previous bit (symbol). In many cases, the context models may be adaptive, such that the probabilities associated with symbols for a given context may change as further bits of the sequence are processed.

Reference is made to FIG. 1, which shows a block diagram of an encoding process 100. The encoding process 100 includes a context modeling component 104 and an entropy encoder 106. The context modeling component 104 receives the input sequence x 102, which in this example is a bit sequence $(b_0, b_1, \ldots, b_n)$. The context modeling component 104 determines a context for each bit b based on one or more previous bits in the sequence, and determines, based on the adaptive context model, a probability p associated with that bit b, where the probability is the probability that the bit will be the Least Probable Symbol (LPS). The LPS may be "0" or "1" in a binary embodiment, depending on the convention or application. The context modeling component outputs the input sequence, i.e. the bits $(b_0, b_1, \ldots, b_n)$ along with their respective probabilities $(p_0, p_1, \ldots, p_n)$. The probabilities are an estimated probability determined by the context model. This data, is then input to the entropy encoder 106, which codes the input sequence using the probability information. For example, the entropy encoder 106 may be a binary arithmetic coder. The entropy encoder 106 outputs a bitstream 108 of encoded data.

It will be appreciated that each bit of the input sequence is processed serially to update the context model, and the serial bits and probability information are supplied to the entropy encoder 106, which then entropy encodes the bits to create the processed bitstream 108.

In some embodiments the encoder 106 may further provide load balancing information to allow the decoder to process the coded data in parallel. The encoder 106 may, in these embodiments, provide the load balancing information as the encoder 106 is able to identify the number of code words associated with each probability within a particular context.

In some embodiments, a decoder will typically generate intermediate phrase words comprised of phrase word bits and packed phrase word bits that require additional processing to yield the phrase word. In general, such packed phrase word bits are a more efficient representation of the bits to reduce storage requirements. For instance, a long string of 1's followed by a '1' or a long string of '1's followed by a '0' may be replaced with a value indicating the number of 1's in the string. The numerical value having been extracted from the entropy encoded code word.

Control logic to convert the numeric value to a string of 1's or 0's may reside either in the decoder, or may reside in a downstream processing block with larger memory buffers to accommodate the expanded string. In the embodiment below it is assumed that said control logic is contained in a downstream processing block, but both embodiments are contemplated.

In some embodiments, explicit probability information may not be passed from the context modeling component 104 to the entropy decoder; rather, in some instances, for each bit the context modeling component 104 may send the entropy decoder, for instance through the entropy encoder 106, an indication of the associated probability such as an index value, flag, control signal or other indicator that reflects the probability estimation made by the context modeling component 104 based on the context model and the current context of the input sequence 102. The indication of the associated probability is indicative of the probability estimate associated with its corresponding bit.

In some embodiments, a probability for each bit will not be communicated, but instead bits of the same probability will be grouped together and the number of bits (or bytes or code words) and the probability of the group will be communicated, for instance as a header for the group.

In some embodiments, the probability information may be communicated as side band information, for instance by transferring a bit to an input buffer assigned to the same associated probability as the bit. In such an embodiment the indication of the associated probability comprises transferring a bit to an input buffer assigned to the associated probability.

In embodiments where load balancing information is provided by the encoder, in some embodiments the load balancing information may be communicated as side band information.

In accordance with one aspect, the present application proposes a hardware architecture for an entropy encoder and a hardware architecture for an entropy decoder. Both hardware architectures having a parallel processing architecture for entropy coding or decoding with a load balancing component for dynamically assigning the allocation of one or more probability trees amongst the parallel processing engines.

In a first embodiment, the load balancing component of the entropy decoder receives load balancing information from the entropy encoder along with the probability information generated by the context modeling component 104. The load balancing information is generated by the encoder 106 to allocate the output code words and associated probability information to each of the encoding or decoding engines such that the computational work load is allocated approximately evenly amongst the engines.

The load balancing information may, for instance, be included as a load balancing field in a header associated with code words output from the entropy encoder 106. The header may further comprise a probability field containing the probability information for that bit sequence. In an alternative embodiment, the load balancing information may be included as an indication of the associated decoder engine such as an index value, flag, control signal or other indicator that reflects the decoder engine assigned by the context modeling component 104 to carry out the decoding operations using the probability assigned to that bit sequence. Similar to the probability information, the indication of the associated decoder engine may alternatively be conveyed using side band information.

In a second embodiment, the encoder and decoder architectures may each include control logic for assessing the bit sequence and associated probability information and allocating the bits and associated probabilities to distribute the computational workload approximately evenly amongst the engines. The second embodiment has an advantage, for instance, in that a parallel encoder/decoder architecture may be provided that is able to dynamically load balance bit sequences to be encoded/decoded independent of the context modeling component 104.

In one aspect, the control logic of the decoder may receive load balancing information from the encoder 106 that indicates the number of code words assigned to a particular probability. The load balancing information allows the control logic to assign decoding elements to each probability to be decoded such that each decoding element has an approximately equal computational load.

In another aspect, the control logic of the decoder may assign the decoding elements based upon the number of bytes assigned to each probability. While the number of bits per code word per probability varies, typically between 3 bits to 8 bits, the number of bytes in the group per probability may be a fair approximation of the number of phrase/code words in the group. The approximation limits the scheduling calculations or information to be communicated, and it would be most accurate when the number of bits per phrase/code word is relatively similar for each probability.

In another aspect, the control logic of the decoder may have access, for instance through a lookup table, to the expected number of bits (or bytes) per code word for each probability. In this aspect, the control aspect may divide the number of bits (or bytes) assigned to each probability by the average number of bits (or bytes) per code word to arrive at an approximate number of code words to be processed. Calculating an approximate number of code words may be more accurate than scheduling based upon the number of bits (or bytes) per probability, particularly where the number of bits per code word varies.

In another aspect, the control logic of the decoder, for instance code word input state machine 302, may assign decoding elements to probabilities from most probable to least probable. In embodiments where the probabilities are not all approximately equal, assigning decoding elements in decreasing order of probability will, on average, result in any load imbalances at the less frequent probabilities. Accordingly, the more frequently encountered probabilities will be well balanced, and any load imbalances will occur after the more probable phrase/code words have been processed. While the load balancing under this aspect is less accurate, the task of scheduling decoding elements for load balancing purposes is greatly simplified. In embodiments where the probabilities are all approximately equal, this heuristic approach will not be as efficient as embodiments with load balancing information supplied by the encoder that allows the decoder to divide the work load among decoding elements by the actual number of code words per probability.

Figure 2A:
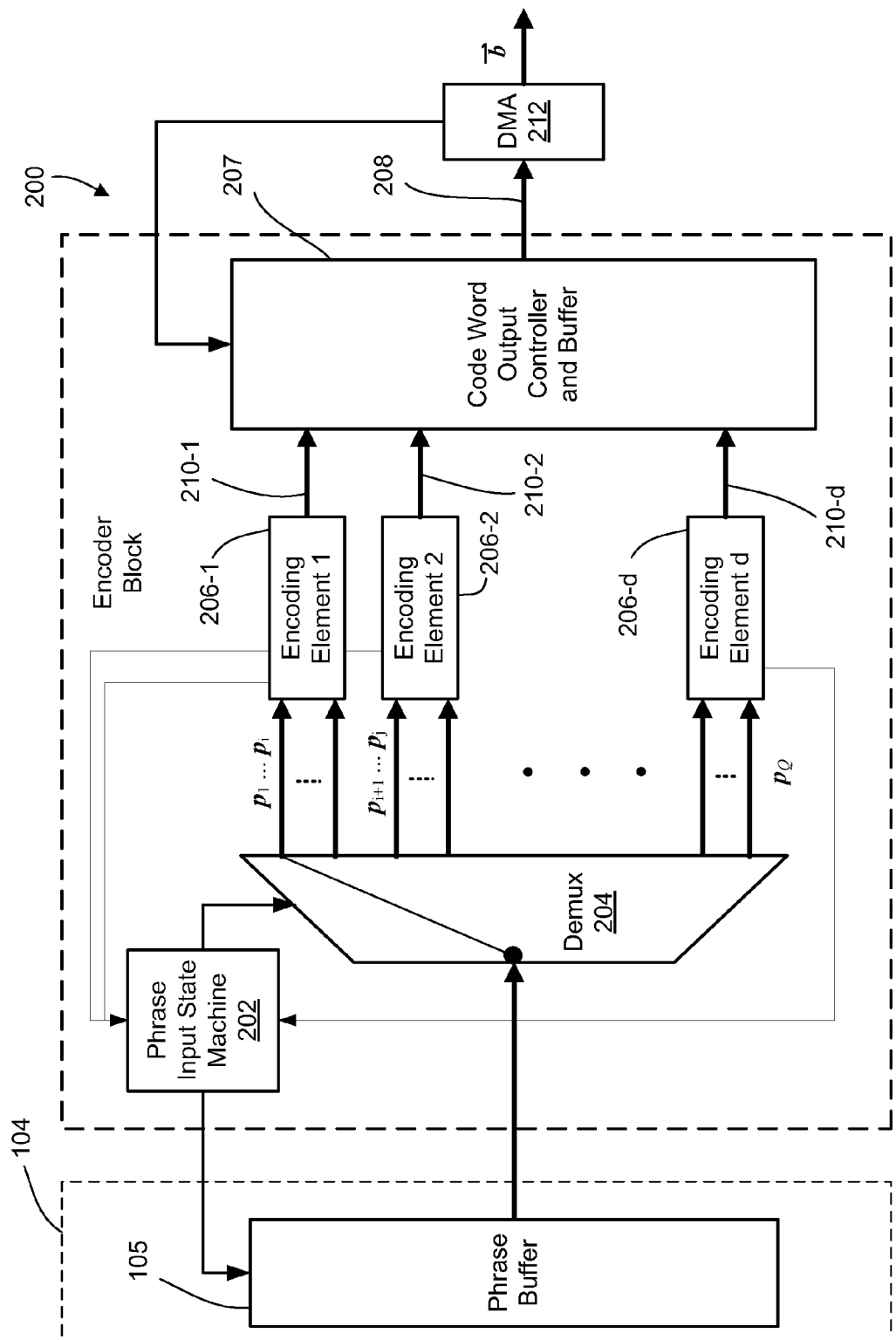
FIG. 2a shows, in block diagram form, an embodiment of an entropy encoder.

Referring to FIG. 2a which shows in block diagram form, an embodiment of an entropy encoder block 200. The entropy encoder block 200 is downstream from a context modeling component 104 which, for each bit of the input sequence, determines an estimated probability based on the context model. The context modeling component assigns each bit to one of N probabilities from the context model, each probability having a search tree associated with it. The context modeler 104 makes the bit and an indication of the associated probability available to the entropy encoder block 200. As indicated above, in an embodiment, the encoder 106 may further provide load balancing information to allocate the bit and the associated probability to one of the encoding engines. In the context of the embodiment of FIG. 2a, the context modeling component is illustrated as presenting a phrase buffer 105 in communication with the entropy encoder block 200.

In the embodiment of FIG. 2a, the entropy encoder block 200 includes a phrase input state machine 202 that is in operative communication with the phrase buffer 105 and a de-multiplexing element 204. The phrase input state machine 202 is also in operative communication with a plurality of encoding elements 206-1 . . . 206-d. The phrase input state machine 202 is operative to receive a state of an input buffer in each encoding element 206-1 . . . 206-d and to send an indication of a probability associated with each phrase word being input into each encoding element 206-1 . . . 206-d. In this embodiment, the phrase input state machine 202 may direct the phrase word and associated indication of probability to one of the encoding elements 206-1 . . . 206-d as specified by the probability information sent with the phrase word and the associated indication of probability from the phrase buffer 105.

In an alternate embodiment, the phrase input state machine 202 may further comprise control logic to assign the phrase word and the indication of the probability to one of the encoding elements 206-1 . . . 206-d based upon a load balancing schedule. In the alternate embodiment, the phrase input state machine 202 maintains a list of encoding elements 206-1 . . . 206-d able to service a probability in a pre-determined order of preference. Upon receiving a phrase word having an associated probability, the phrase input state machine 202 matches the received phrase word with the first available encoding element 206-1 . . . 206-d from the list corresponding to phrase word's probability information.

As described above, the phrase buffer 105 may provide an indication of the associated probability, for instance by including a flag or control signal corresponding to each phrase word. The embodiment of FIG. 2a provides an embodiment for providing an indication of the associated probability by side band information by directing the input phrase words to an input buffer assigned to a specific lookup table that corresponds to the associated probability. Both embodiments are contemplated.

The phrase input state machine 202 is further operative to receive probability and buffer information from the phrase buffer 105 and to direct the phrase buffer 105 to transfer an indicated phrase word to the de-multiplexing element 204.

The de-multiplexing element 204 is in communication with the phrase buffer to receive phrase words as directed by the phrase input state machine 202. The phrase input state machine 202 is further operative to direct the de-multiplexing element 204 to direct the received phrase word to one of a plurality of input buffers (not shown in this figure) distributed across the plurality of encoding elements 206-1 . . . 206-d when an input buffer is detected as available.

Each of the plurality of input buffers is associated with one of the N probabilities from the context model. In the embodiment of FIG. 2a there are Q input buffers (Q>N), each buffer is associated with one of the N probabilities such that all N probabilities are represented.

Each encoding element 206-1 . . . 206-d is operative to encode bits associated with a subset of the N probabilities. In order to encode all possible phrases, it is necessary that each of the N probabilities are represented by at least one encoding element 206-1 . . . 206-d. In an embodiment, the phrase input state machine 202 maintains an association for each encoder element 206-1 . . . 206-d with the subset of probabilities serviced by that encoder element 206-1 . . . 206-d. The phrase input state machine 202 may assign a phrase word to one of a subset of encoder elements 206-1 . . . 206-d that service a particular probability, for instance according to a pre-determined order of preference depending upon the availability of each of those encoder elements 206-1 . . . 206-d in the subset.

Having a greater than N input buffers allows for multiple encoding elements to process the phrase words having the same associated probability. This processing may occur at the same time, or may occur while the other encoding elements are processing phrase words having a different associated probability. This is useful, for instance, where some probabilities have much higher workload than others, such that it would be advantageous to have multiple encoding elements available to process phrase words associated with those probabilities so that phrase words continue to be processed in parallel, rather than waiting for one encoding element to process a string of phrase words having the same associated probability. This also allows for flexibility in assigning phrase words to encoding elements.

Figure 4A:
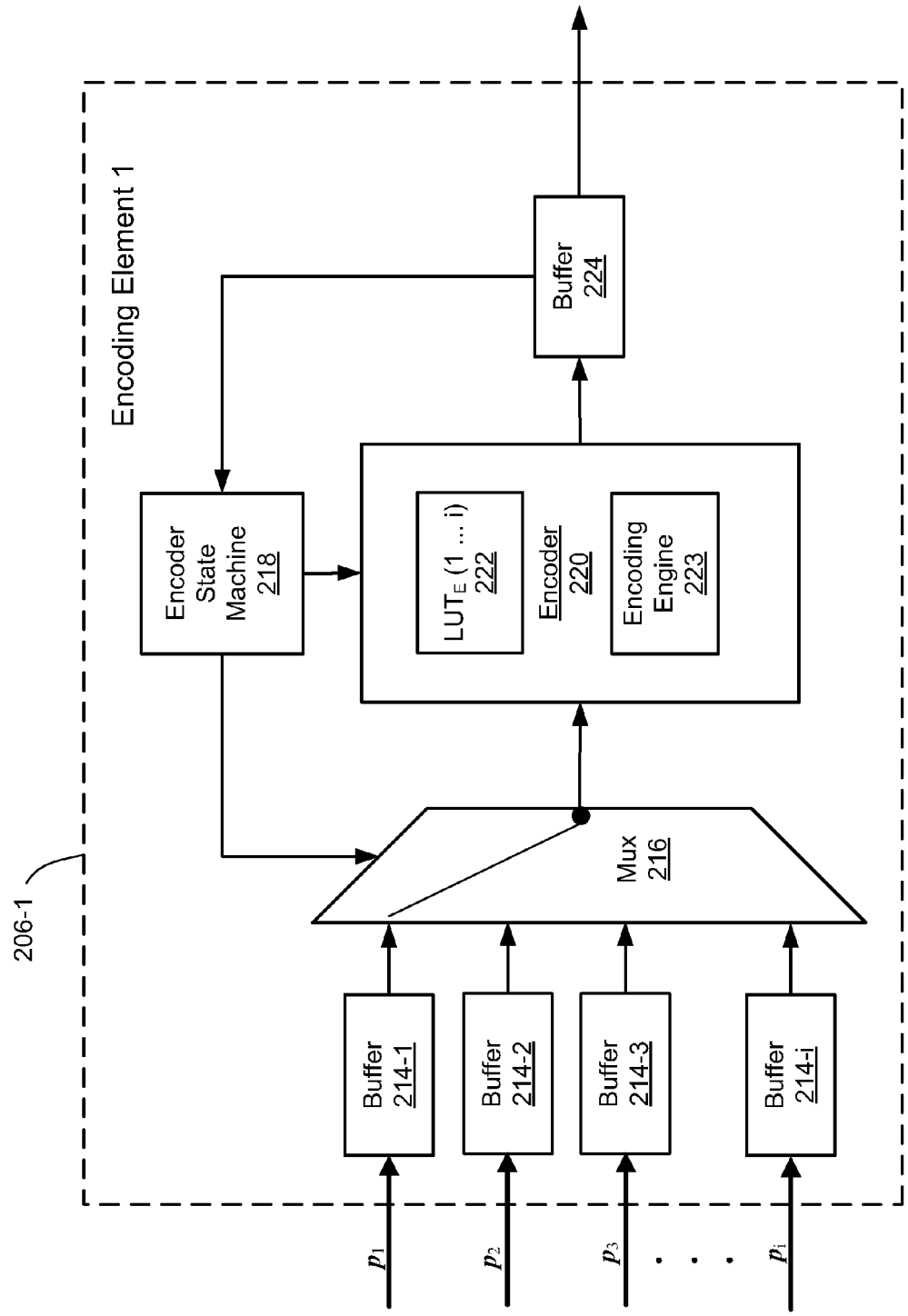
FIG. 4a shows, in block diagram form, an embodiment of an entropy encoder element.

In the embodiment of FIG. 4a, for instance, the subset of probabilities serviced by the encoding element 206-1 corresponds to encoding element input buffers 214-1 . . . 214-i of the encoding element 206-1. Each of the encoding element input buffers 214-1 . . . 214-i provide probability information as sideband information to the encoding element 206-1. Referring back to the embodiment of FIG. 2a, the phrase input state machine 202 and demultiplexer 204 convey the probability information by sorting phrase words amongst the input buffers 214-1 . . . 214-Q of the encoding elements 206-1 . . . 206-d according to the probability associated with each of the input buffers 214-1 . . . 214-Q.

Figure 10A:
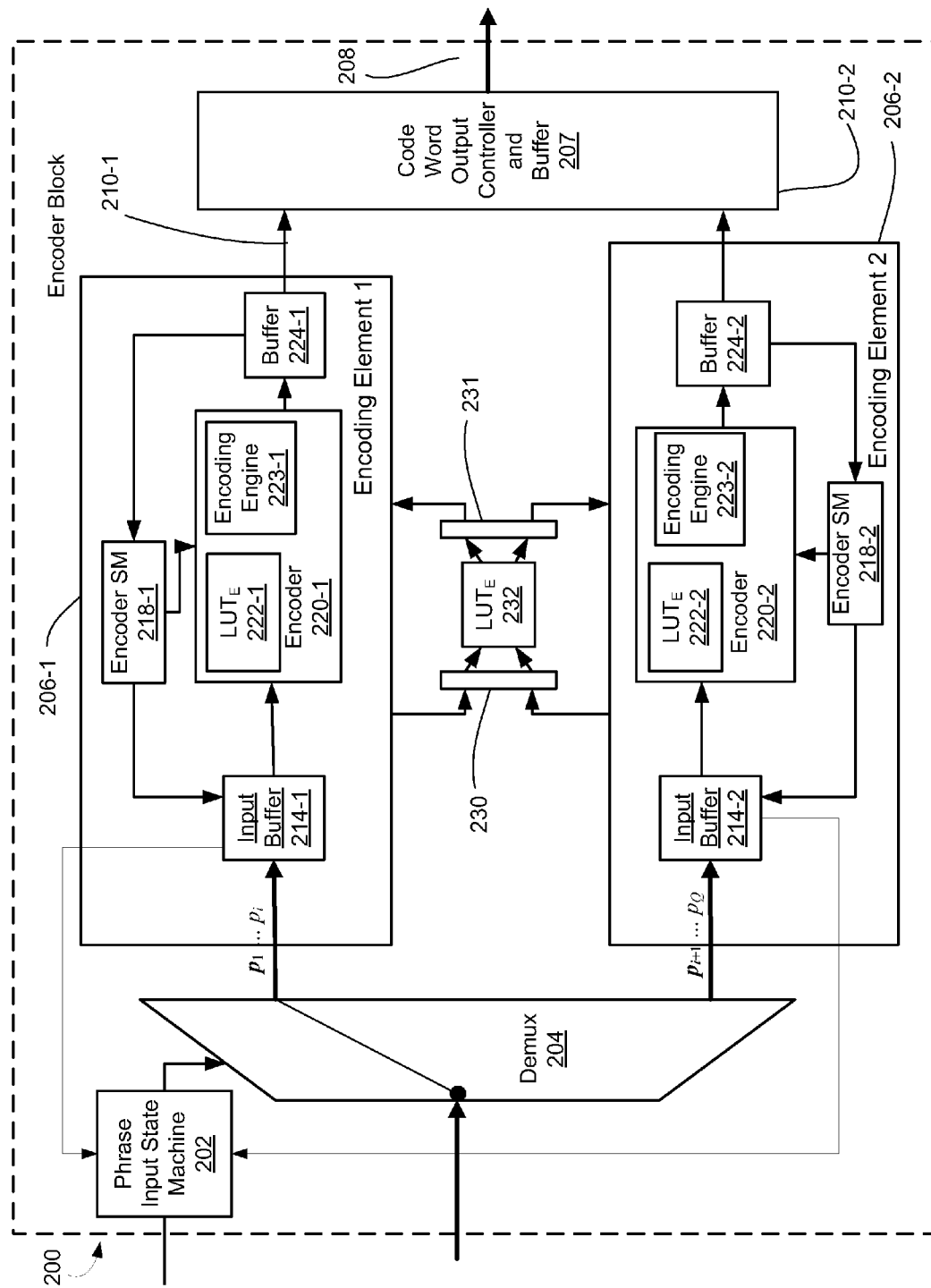
FIG. 10a shows, in block diagram form, an embodiment of an entropy encoder.

In an alternate embodiment, d input buffers are provided, each buffer associated with one of the d encoder elements. Encoder elements may process more than one probability by receiving an indication of associated probability, for instance by way of an index, flag or control signal as described above. In the embodiment of FIG. 10a, for instance, 2 encoder elements 206-1, 206-2 each provide a single input buffer 214-1 and 214-2 respectively.

The entropy encoding elements 206-1 . . . 206-d each communicate through a communication channel output, 210-1 . . . 210-d respectively, to a code word output controller and buffer 207. As will be appreciated, inclusion of an element performing the function of a code word output controller and buffer 207 is not necessarily included within the encoder block 200, provided that downstream components include the functionality to combine the outputs 210-1 . . . 210-d. In the embodiment of FIG. 2a, a downstream DMA module 212 is illustrated for transferring completed code words on as a bitstream.

Figure 2B:
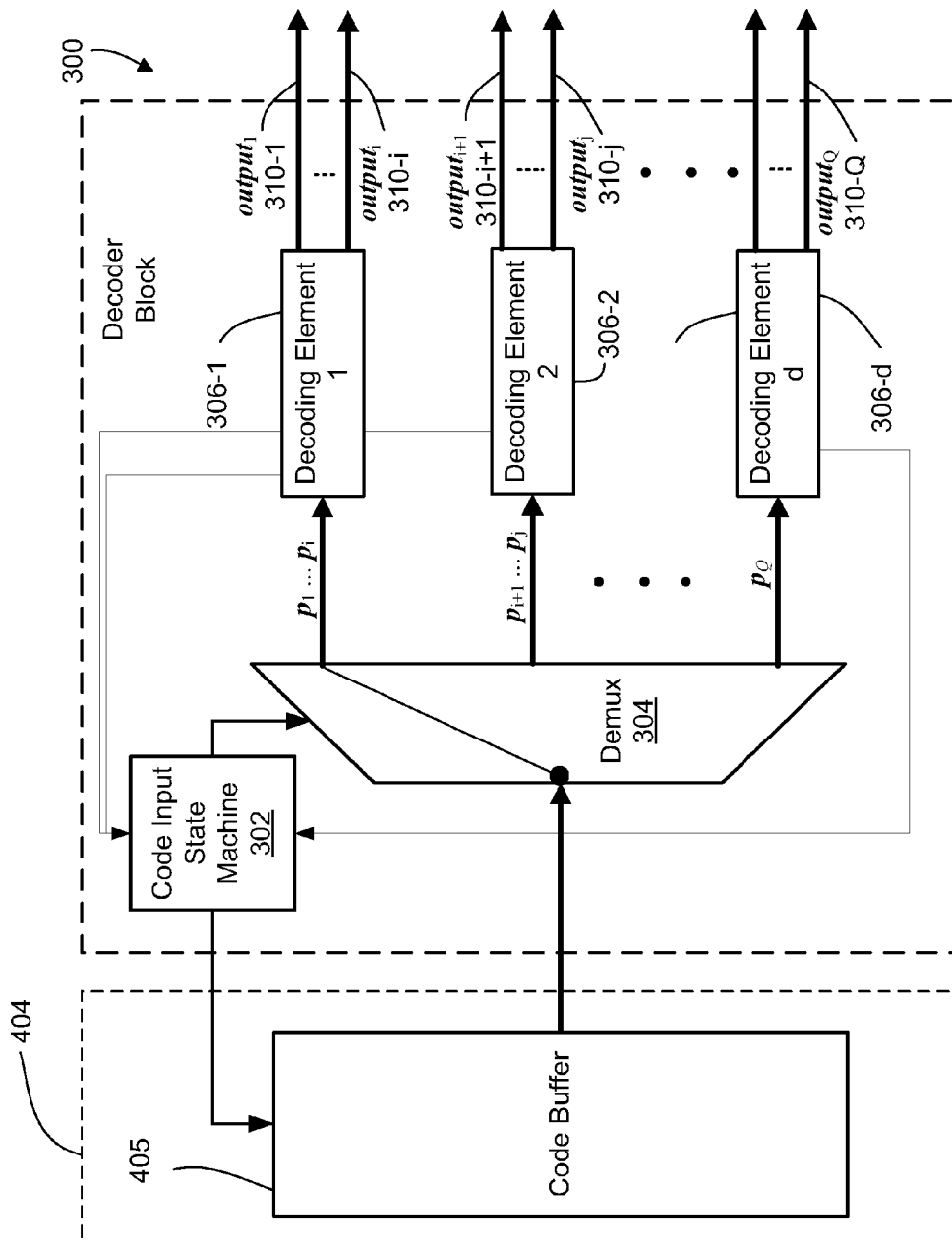
FIG. 2b shows, in block diagram form, an embodiment of an entropy decoder.

Referring to FIG. 2b which shows in block diagram form, an embodiment of an entropy decoder block 300. The entropy decoder block 300 is downstream and in communication with a code buffer 405. The code buffer 405 contains the code words and probability information produced by the entropy encoder 106. In an embodiment, the code buffer 405 may further contain load balancing information associated with the code words produced by the entropy encoder 106.

The entropy decoder block 300 includes a code input state machine 302 that is in operative communication with the code buffer 405 and a de-multiplexing element 304. The code input state machine 302 is also in operative communication with a plurality of decoding elements 306-1 . . . 306-d. The code input state machine 302 is operative to receive a state of an input buffer in each decoding element 306-1 . . . 306-d and to send an indication of a probability associated with each code word being input into each decoding element 306-1 . . . 306-d. In the embodiment where the entropy encoder 106 provides load balancing information, the code input state machine 302 may further allocate the indication of probability and the code word to a particular decoding element 306-1 . . . 306-d using the load balancing information.

In one aspect, the load balancing information comprises the encoder 106 assembling the encoded bitstream into work packages of roughly equal processing load as determined by the encoder 106. In an embodiment, the work packages may be identified by pointers identifying the start (or finish) of each work package. In an alternate embodiment, the work packages may be identified by terminators or headers in the bitstream. The encoder 106 further provides probability information for each work package.

In the alternate embodiment, the code input state machine 302 may further comprise control logic to assign the code word and the indication of the probability to one of the decoding elements 306-1 . . . 306-d without receiving load balancing information from the encoder 106.

In an embodiment, the code input state machine 302 maintains an association for each decoder element 306-1 . . . 306-d with the subset of probabilities serviced by that decoder element 306-1 . . . 306-d. The code input state machine 302 may assign a code word to one of a subset of decoder elements 306-1 . . . 306-d that service a particular probability, for instance according to a pre-determined order of preference depending upon the availability of each of those decoder elements 306-1 . . . 306-d in the subset.

In an embodiment, the code input state machine 302 may assign decoder elements 306-1 . . . 306-d in decreasing order of the likelihood of code word probability. In other words, code words with a more probable associated probability are assigned first and code words with a least probable associated probability are assigned last in order.

In an aspect, the code input state machine 302 is operative to assign the code word based upon an estimate of the work load determined by the code input state machine 302. The code input state machine 302 generating the estimate based upon the size of the code word derived from probability information provided by the encoder 106.

In one embodiment, the encoder 106 may provide load balancing information in the form of the number of code words associated with a probability. The code input state machine 302 may assign the set of code words associated with a probability to one or more decoding elements 306-1 . . . 306-d in accordance with the magnitude of the number.

In the embodiment of FIG. 2b, the code input state machine 302 is further operative to receive probability and buffer information from the code buffer 405 and to direct the code buffer 405 to transfer an indicated code word to the de-multiplexing element 304.

The de-multiplexing element 304 is in communication with the code buffer to receive code words as directed by the code input state machine 302. The code input state machine 302 is further operative to direct the de-multiplexing element 304 to direct the received code word to an input buffer (not shown in this figure) of one of the plurality of decoding elements 306-1 . . . 306-d able to service the probability associated with the code word when an input buffer is detected as being available. Each of the plurality of decoding elements 306-1 . . . 306-d having an associated subset of the N probabilities from the context model, such that every probability is assigned to at least one decoding element 306-1 ... 306-d.

Each decoding element 306-1 ... 306-d is operative to decode bits associated with a subset of associated probabilities from the N probabilities. In order to decode all possible code words, it is necessary that each of the N probabilities are represented by at least one associated decoding element 306-1 ... 306-d.

In the embodiment of FIG. 2b, the entropy decoders 306-1 ... 306-d each communicate through a communication channel output, 310-1 ... 310-Q (Q>N) for output to a downstream processing component. Additional control logic will be required to combine the outputs of the same probability from different decoding elements 306-1 ... 306-d, to group all outputs of the same probability for subsequent reassembly to generate the output bit sequence. The additional control logic may be maintained in the downstream processing component, or the outputs may be combined within the decoder block 300 before being passed to the downstream processing component.

In the context of decoding an encoded bitstream, the code input state machine 302 sorts an input code word based upon its probability to identify a decoding search tree lookup table associated with that probability and then assigns the code word to an entropy decoder able to access the corresponding decoding search tree lookup table to traverse the associated tree to arrive at a leaf node that yields leaf node contents for that code word to generate the decoded phrase word.

Figure 3A:
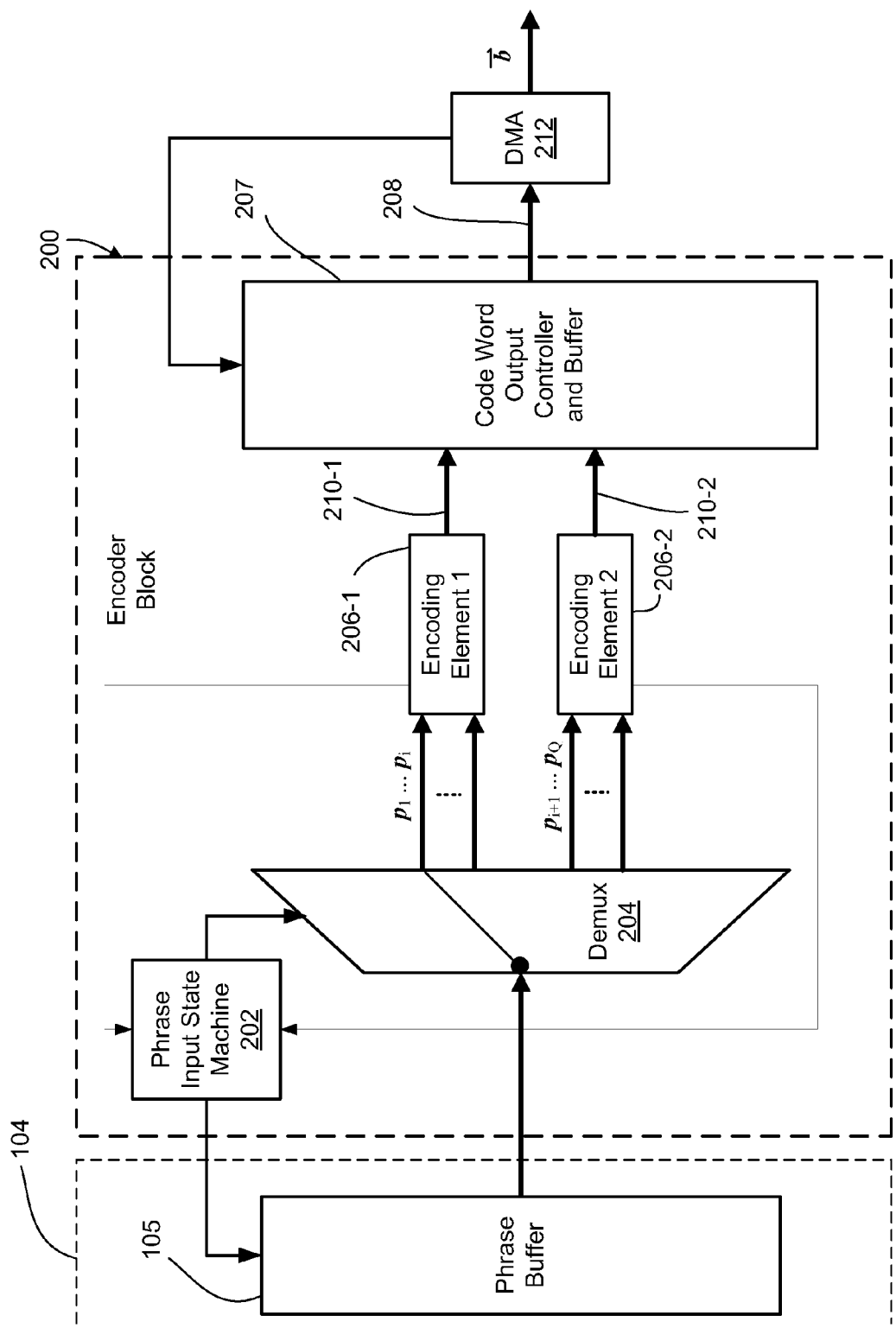
FIG. 3a shows, in block diagram form, an embodiment of an entropy encoder.

FIG. 3a illustrates an embodiment of FIG. 2a where d=2 such that there are two encoding elements 206-1 206-2. Other than the selection of an embodiment of two encoding elements 206-1 206-2, FIG. 3a is similar to FIG. 2a.

Figure 3B:
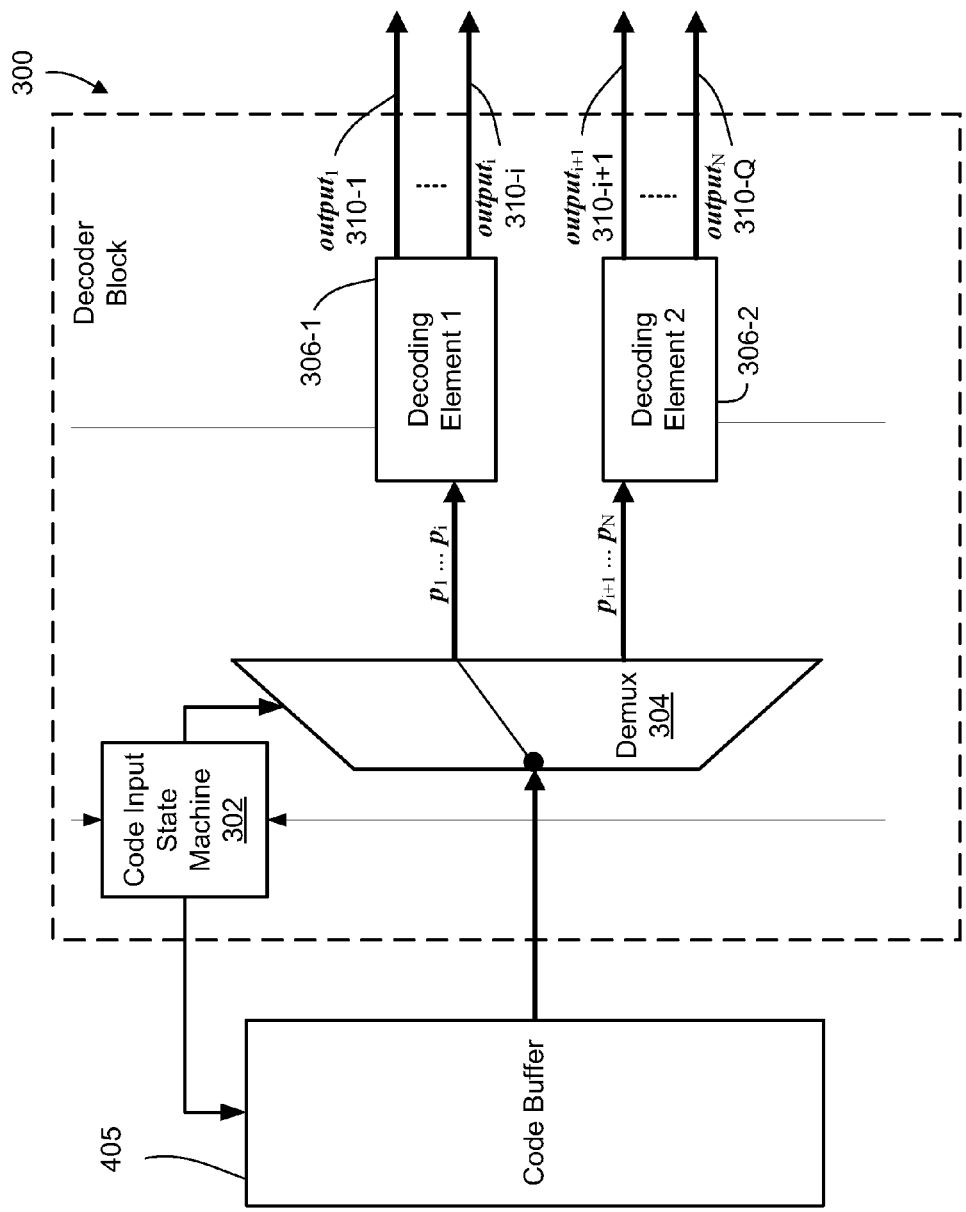
FIG. 3b shows, in block diagram form, an embodiment of an entropy decoder.

FIG. 3b illustrates an embodiment of FIG. 2b where d=2 such that there are two decoding elements 306-1 306-2. Other than the selection of an embodiment of two decoding elements 306-1 306-2, FIG. 3b is similar to FIG. 2b.

FIG. 4a is an expanded view of an embodiment of encoding element 206-1 from FIGS. 2a and 3a. The encoding element 206-1 comprises i encoder input buffers 214-1 ... 214-i, each encoder input buffer 214-1 ... 214-i associated with one of the N probabilities. A multiplexing element 216, driven by an encoder state machine 218, is in communication with the encoder input buffers 214-1 ... 214-i and an encoder 220. Entropy encoder 220 comprises an encoding engine 223 and i encoding search tree lookup tables 222-1 ... 222-i. Each encoding search tree lookup table 222-1 ... 222-i corresponding to one of the encoder input buffers 214-1 ... 214-i and its associated probability. The encoding search tree lookup tables 222-1 ... 222-i each comprising an encoding search tree associated with one of the associated probabilities.

The encoder state machine 218 is operative to direct the multiplexing element 216 to transfer phrase bits from the encoder input buffers 214-1 ... 214-i to the encoder 220 for encoding when the output buffer 224 is available. The encoder state machine 218 is further operative to direct the encoder 220 to select an encoding search tree lookup table from the i encoding search tree lookup tables 222-1 ... 222-i, the encoding search tree lookup table associated with the same probability as the encoder input buffer 214-1 ... 214-i.

Encoding engine 223 operates on the phrase bits by traversing the selected encoding search tree lookup table to generate an output code word. Upon generating the output code word, the encoder 220 transfers the code word to a code word output buffer 224. When a downstream processing block transfers the code word from the code word output buffer 224, the encoder state machine 218 selects another encoder input buffer 214-1 ... 214-i for encoding.

Figure 4B:
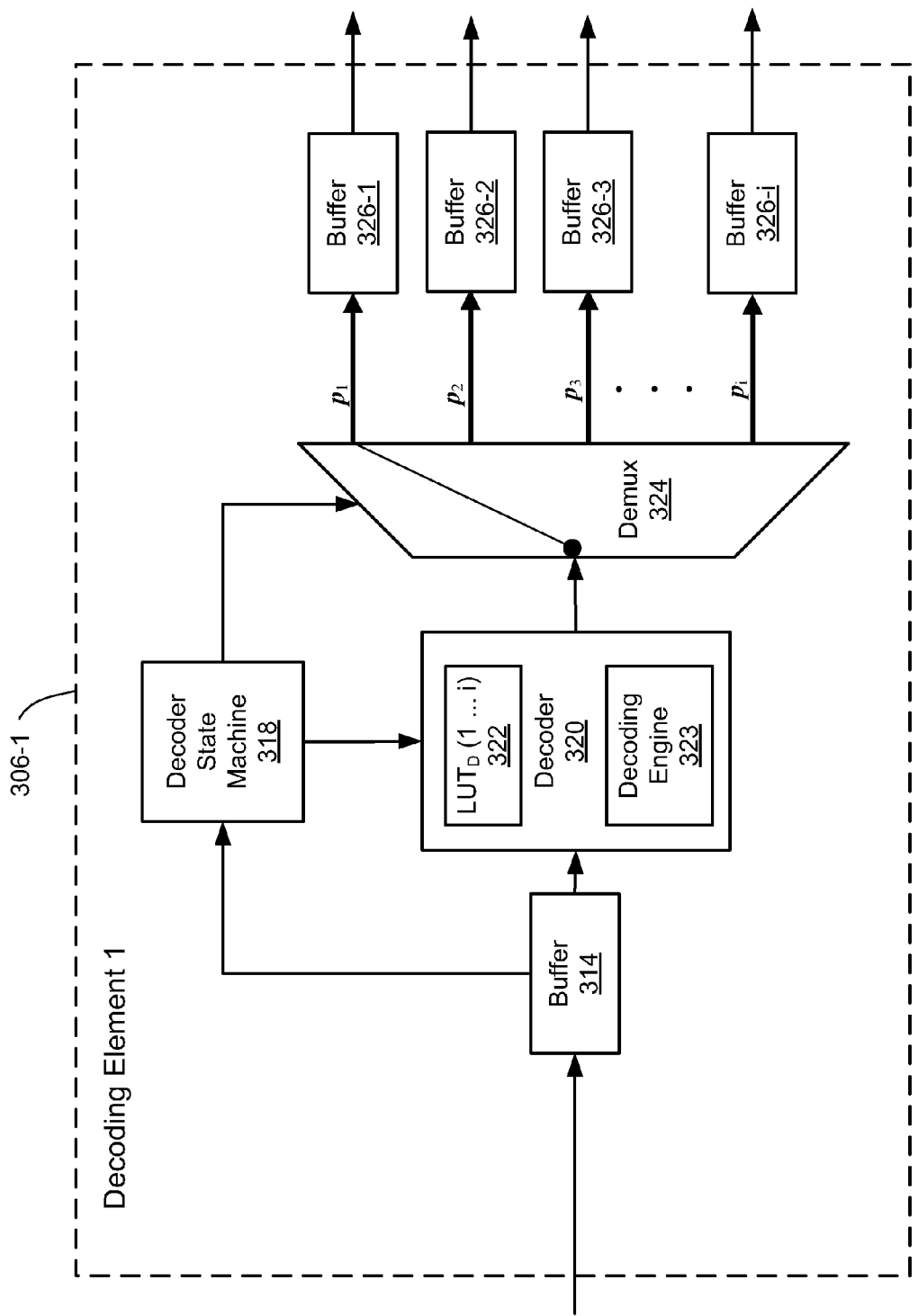
FIG. 4b shows, in block diagram form, an embodiment of an entropy decoder element.

FIG. 4b is an expanded view of an embodiment of decoding element 306-1 from FIGS. 2b and 3b. The decoding element 306-1 comprises a decoder input buffer 314 in communication with a decoder state machine 318 and an entropy decoder 320. The decoder state machine 318 in communication with the decoder input buffer 314, the decoder 320 and a de-multiplexing element 324. The decoder state machine operative to read from the decoder input buffer 314 an indication of the probability associated with the code word in the decoder input buffer 314, and operative to direct the decoder 320 to select a decoding search tree lookup table 322-1 ... 322-i corresponding to the probability associated with the code word.

The decoder 320 comprising an entropy decoding engine 323 and i decoding search tree lookup tables 322-1 ... 322-i. Each decoding search tree lookup table 322-1 ... 322-i corresponding to one of the associated probabilities serviced by the decoding element 306-1. The decoding search tree lookup tables 322-1 ... 322-i each comprising a decoding search tree associated with an associated probability.

The decoder state machine 318 further operative to direct the decoder de-multiplexing element 324 to distribute output bits from the decoder 320 to one of i decoder output buffers 326-1 ... 326-i. Each decoder output buffer 326-1 ... 326-i corresponding to one of the i probabilities serviced by the encoding element 306-1.

Decoding engine 323 operates on the code bits by traversing the selected decoding search tree lookup table 322-1 ... 322-i to locate the leaf node contents. The leaf node contents comprising a portion, or a compressed portion, of the phrase being decoded. Upon generating the leaf node contents, the decoder 320 transfers the leaf node contents to the decoder de-multiplexing element 324 for transfer to the corresponding decoder output buffer 326-1 ... 326-i.

The leaf node contents will need to be collected, assembled and decompressed in a downstream processing component to re-create the phrase word.

Figure 5A:
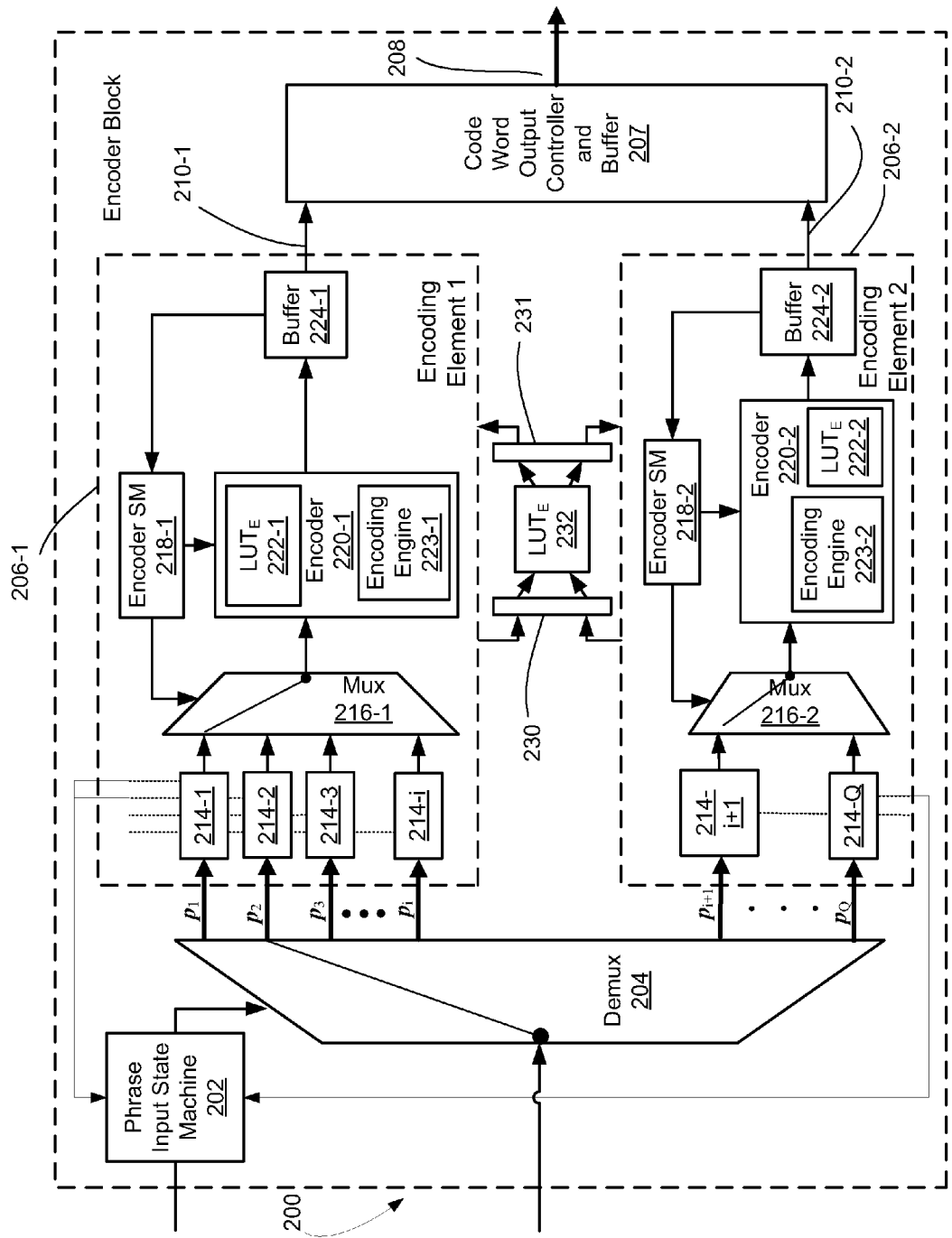
FIG. 5a shows, in block diagram form, an embodiment of an entropy encoder.
Figure 5B:
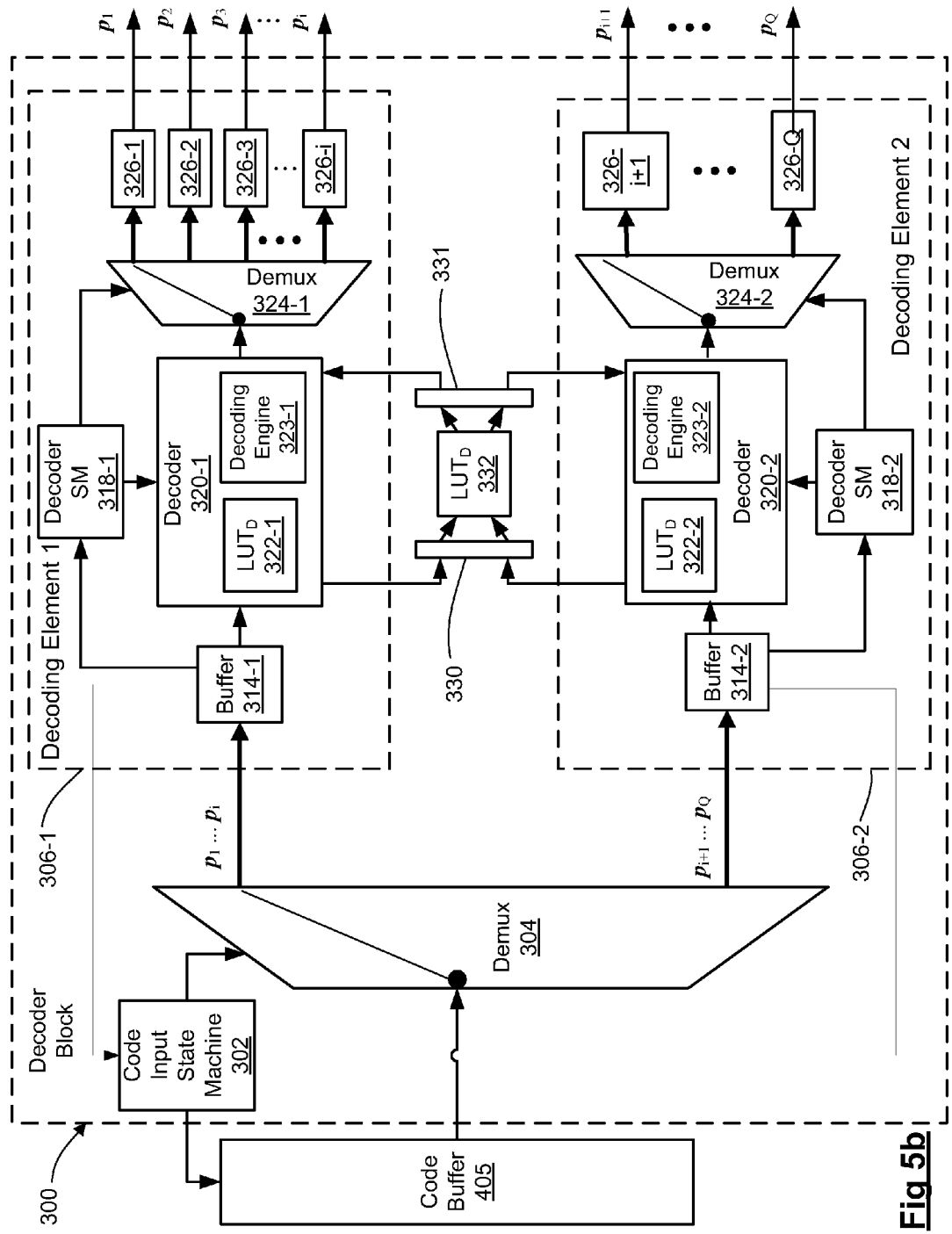
FIG. 5b shows, in block diagram form, an embodiment of an entropy decoder.
Figure 5C:
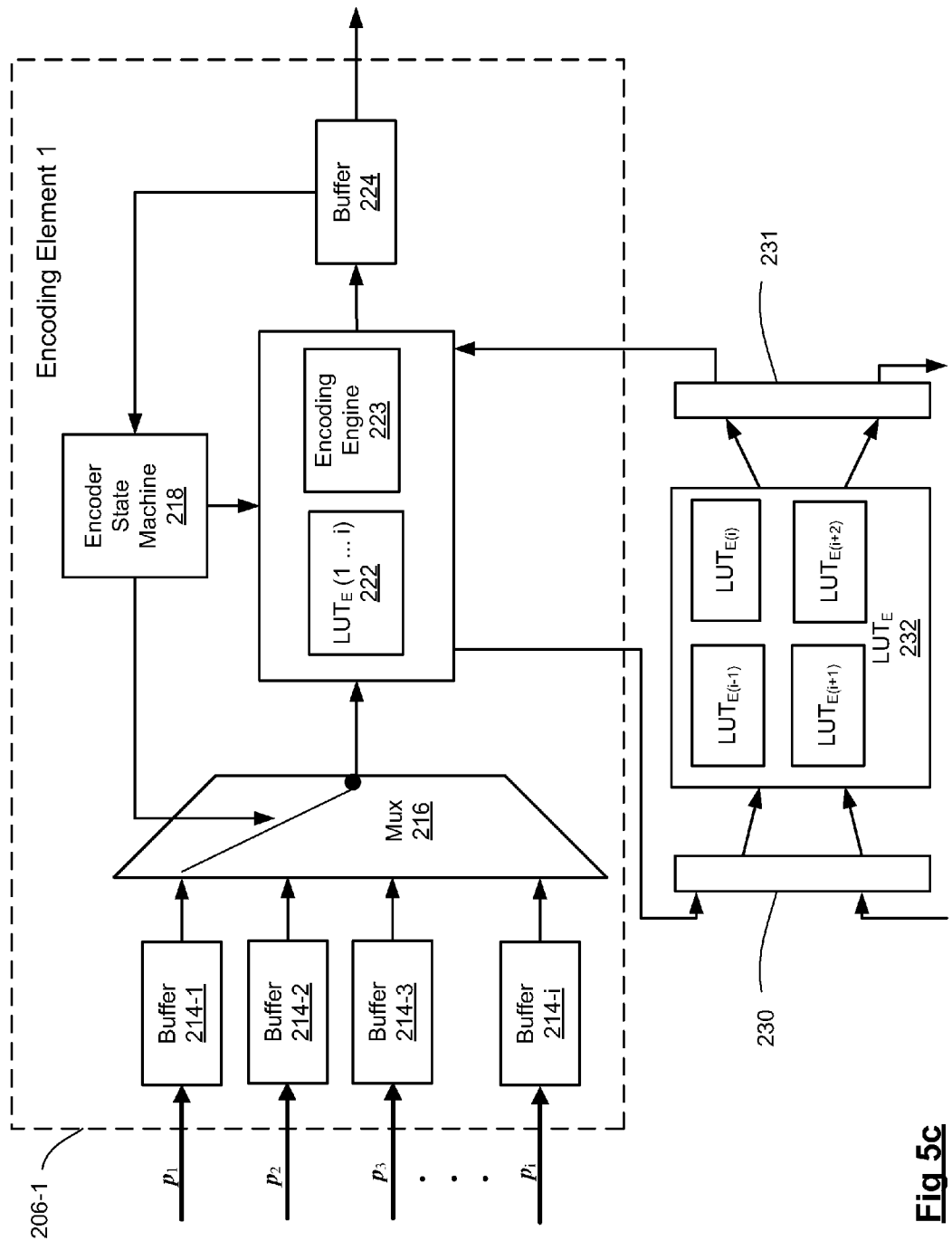
FIG. 5c shows, in block diagram form, an embodiment of an entropy encoder.
Figure 5D:
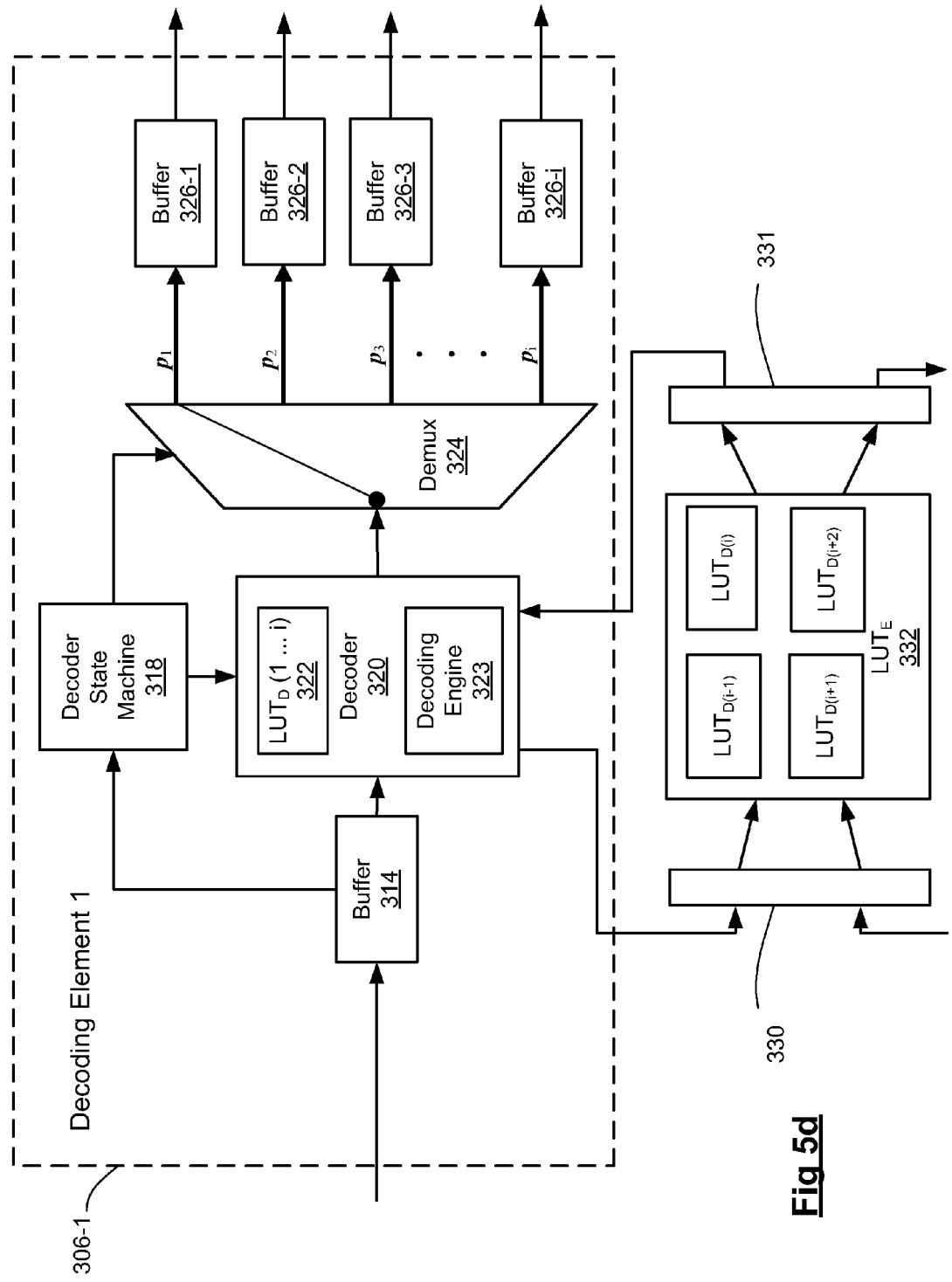
FIG. 5d shows, in block diagram form, an embodiment of an entropy decoder.

FIG. 5a is an expanded view of an embodiment of FIG. 3a showing the encoding elements 206-1 206-2 in simplified expanded form where the encoding elements 206-1 206-2 share one or more encoding search tree lookup tables $LUT_E$ 232. Reference numerals in the encoding elements 206-1 206-2 include a suffix of -1 or -2 to identify them as separate components. In the embodiment, a code word output controller and buffer 207 receives the outputs 210-1 210-2.

In the embodiment of FIG. 5a, each of encoding elements 206-1 206-2 further include their own subset of encoding search tree lookup tables $LUT_E$ 222-1 222-2. In an alternate embodiment, the encoding elements 206-1 206-2 may only rely upon a shared set of encoding search tree lookup tables $LUT_E$ 232. In a further alternate embodiment, some of the encoding elements 206-1 206-2 may solely rely upon their own subset of encoding search tree lookup tables $LUT_E$ 222-1 222-2, some of the encoding elements 206-1 206-2 may solely rely upon the set of shared encoding search tree lookup tables $LUT_E$ 232 or some of the encoding elements 206-1 206-2 may rely upon a combination of their own subset of encoding search tree lookup tables $LUT_E$ 222-1 222-2 and the set of shared encoding search tree lookup tables $LUT_E$ 232.

While the embodiment of FIG. 5a only includes two encoding elements 206-1 206-2 and one set of shared encoding search tree lookup tables $LUT_E$ 232, the encoder block 200 may comprise a plurality of encoding elements 206-1 206-2 and one or more sets of one or more shared encoding search tree lookup tables $LUT_E$ 232.

Generally, it is advantageous to limit the number of lookup tables to minimize the size of the encoder block 200 or decoder block 300. The advantages of reducing the size of the encoder block 200 or decoder block 300, however, must be balanced against the availability of encoding elements 206-1 . . . 206-$d$ or decoding elements 306-1 . . . 306-$d$ to process a bit having a given probability.

FIG. 5$c$ is a closeup view of the encoding element 206-1 and the shared encoding search tree lookup tables $LUT_E$ 232 from FIG. 5$a$. As illustrated, the encoding elements 206-1 206-2 access the shared encoding search tree lookup tables $LUT_E$ 232 through an input encoder crossbar switch 230 for connecting the encoding elements 206-1 206-2 with the one or more shared encoding search tree lookup tables $LUT_E$ 232. An output encoder crossbar switch 231 connects the one or more shared encoding search tree lookup tables $LUT_E$ 232 with the encoding elements 206-1 206-2 to communicate the values output from the shared encoding search tree lookup tables $LUT_E$ 232 for use by the encoding elements 206-1 206-2.

In the embodiment illustrated in FIG. 5$c$, only four shared encoding search tree lookup tables $LUT_{E\,(J-1)}$ . . . $LUT_{E\,(j+2)}$ are illustrated, though it is understood that there can be any number from 1 to some number greater than N to allow for multiple copies of the same encoding search tree lookup table to allow multiple encoding elements 206-1 . . . 206-$d$ to operate on the same probability at the same time.

While it is possible for two of the encoding elements 206-1 . . . 206-$d$ to operate on the same encoding search tree lookup table at the same time, this is undesirable as it will likely slow the operation of the encoder unacceptably. Accordingly, the load balancing between encoding elements 206-1 . . . 206-$d$ preferably accounts for the encoding search tree lookup tables available to each encoding element 206-1 . . . 206-$d$ to avoid assigning two different encoding elements to the same encoding search tree lookup table in the set of one or more shared encoding search tree lookup tables $LUT_E$ 232.

FIG. 5$b$ is an expanded view of an embodiment of FIG. 3$b$ showing the decoding elements 306-1 306-2 in simplified expanded form, where the decoding elements 306-1 306-2 share one or more decoding search tree lookup tables $LUT_D$ 332. Reference numerals in the decoding elements 306-1 306-2 include a suffix of -1 or -2 to identify them as separate components. As illustrated, the entropy decoder block 300 outputs leaf node contents.

In the embodiment of FIG. 5$b$, each of decoding elements 306-1 306-2 further include their own subset of decoding search tree lookup tables $LUT_D$ 322-1 322-2. In an alternate embodiment, the decoding elements 306-1 306-2 may only rely upon a shared set of one or more decoding search tree lookup tables $LUT_D$ 332. In a further alternate embodiment, some of the decoding elements 306-1 306-2 may solely rely upon their own subset of decoding search tree lookup tables $LUT_D$ 322-1 322-2, some of the decoding elements 306-1 306-2 may solely rely upon the set of shared decoding search tree lookup tables $LUT_D$ 332 or some of the decoding elements 306-1 306-2 may rely upon a combination of their own subset of decoding search tree lookup tables $LUT_D$ 322-1 322-2 and the set of shared decoding search tree lookup tables $LUT_D$ 332.

While the embodiment of FIG. 5$b$ only includes two decoding elements 306-1 306-2 and one set of one or more shared decoding search tree lookup tables $LUT_D$ 332, the decoder block 300 may comprise a plurality of decoding elements 306-1 306-2 and one or more sets of one or more shared decoding search tree lookup tables $LUT_D$ 332.

FIG. 5$d$ is a closeup view of the decoding element 306-1 and the shared decoding search tree lookup tables $LUT_D$ 332 from FIG. 5$b$. As illustrated, the decoding elements 306-1 306-2 access the shared decoding search tree lookup tables $LUT_D$ 332 through an input decoder crossbar switch 330 for connecting the decoding elements 306-1 306-2 with the one or more shared decoding search tree lookup tables $LUT_D$ 332. An output decoder crossbar switch 331 connects the one or more shared decoding search tree lookup tables $LUT_D$ 332 with the decoding elements 306-1 306-2 to communicate the values output from the shared decoding search tree lookup tables $LUT_D$ 332 for use by the decoding elements 306-1 306-2.

In the embodiment illustrated in FIG. 5$d$, only four shared decoding search tree lookup tables $LUT_{D(j-1)}$ . . . $LUT_{D(j+2)}$ are illustrated, though it is understood that there can be any number from 1 to some number greater than N to allow for multiple copies of the same lookup table to allow multiple decoding elements 306-1 . . . 306-$d$ to operate on the same probability at the same time.

While it is possible for two of the decoding elements 306-1 . . . 306-$d$ to operate on the same decoding search tree lookup table at the same time, this is undesirable as it will likely slow the operation of the decoder block 300 unacceptably. Accordingly, the load balancing between decoding elements 306-1 . . . 306-$d$ preferably accounts for the decoding search tree lookup tables available to each decoding element 306-1 . . . 306-$d$ to avoid assigning two different decoding elements to the same lookup table in the set of one or more shared lookup tables $LUT_D$ 332.

Figure 6:
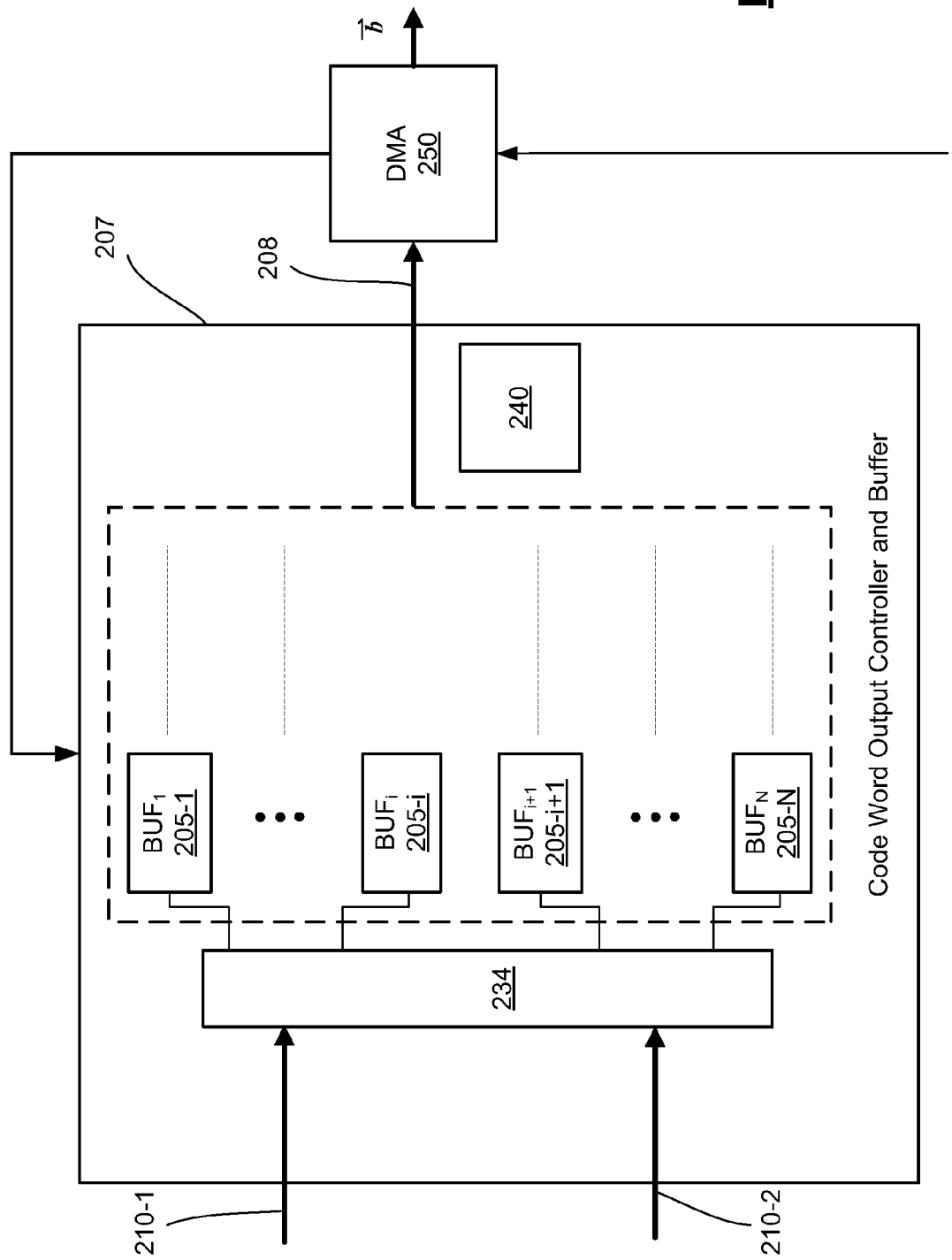
FIG. 6 shows, in block diagram form, an embodiment of a code word output controller and buffer.

FIG. 6 is a simplified block diagram of an embodiment of a code word output controller and buffer 207 for assembling code words from the communication channels 210-1 210-2 of the encoding elements 206-1 206-2. The code word output controller and buffer 207 receives code word bits through the communication channels 210-1 210-2 along with an indication of the associated probability for each set of code word bits. Control logic 240 within the code word output controller and buffer 207 may direct the code word bits to a corresponding code word output buffer 205-1 . . . 205-N. In the embodiment illustrated, the communication channels 210-1 and 210-2 are connected to the N code word output buffers 205-1 . . . 205-N that correspond to the N probabilities through a code word crossbar input switch 234. As phrase words are processed by the encoding elements 206-1 and 206-2, the processed code word bits are collected in the code word buffers 205-1 . . . 205-N until a code word is completed.

While the code word output controller and buffer 207 is shown as being separate from downstream DMA module 250 for clarity, it will be appreciated that in an embodiment the code word output controller and buffer 207 could also be incorporated into the DMA module 250. In this embodiment the DMA module 250 would incorporate the functionality described herein as being attributed to the code word output controller and buffer 207.

The code word output controller and buffer 207 may be considered part of the encoder block 200, which may also include the DMA module 250 in some embodiments.

In an embodiment, the code word output controller and buffer 207 may include control logic 240, such as a counter, for counting the number of code words output by the encoding elements 206-1 206-2 associated with each of the N probabilities within a context. The control logic 240 may receive input from the communication channels 210-1 210-2 and increment the code word count for each probability as the code word and associated probability is detected as being input from the communication channels 210-1 210-2. Alternatively, for instance, the control logic 240 may receive input from each of the code word buffers 205-1 . . . 205-N and increment the code word count for each probability as the corresponding code word buffer 205-1 . . . 205-N receives a completed code word. The control logic 240 may provide a count directly to a downstream processing block, such as DMA module 250, or alternatively may provide the count as side band information.

In an alternate embodiment, control logic 240 may further output the number of bits (or bytes) of each code word output by the encoding elements 206-1 206-2.

The output of the control logic 240, whether the number of code words or, the number of bits (or bytes) of each code word, comprises load balancing information that may be used by a decoder to allocate code words to one of a plurality of decoding elements 306-1 . . . 306-d.

In an embodiment, the code word output controller and buffer 207 may further be operative to assemble the completed code words into work packages of approximately the same amount of processing work. Preferably each work package comprises a plurality of code words to minimize the amount of load balancing information required to be sent with the code words as output from the encoder 106.

The work packages may be divided, for instance, by probability. This embodiment further reduces the amount of probability information required since one identifier of probability information is required for all code words in the work package.

Alternatively, a work package may include code words of different probability, provided that there is at least one decoding element operative to process all probabilities grouped in the work package and the additional probability information is included. In an embodiment, code words associated with probabilities in the shared decoding search tree lookup tables $LUT_E$ 332 may be assembled together in a work package along with probability information.

Identification of work packages may be included, for instance, by including terminators in the output bitstream. The inclusion of a terminator for each work package may, however, reduce the compression ratio achievable by the encoder.

In an alternate preferred embodiment, identification of work packages may be included as a set of pointers, each pointer identifying a work package in a segment of the bitstream. The segment of the bitstream may be allocated, for instance, by all code words within a context identified by the context modeler 104. The pointer information may be transmitted as a header or footer to the segment. Alternatively all pointer information may be collected and included, for instance as a header, once all phrase words have been encoded. Typically, it is preferred to include the pointer information with segments of the bitstream to locate the pointer information with the code words when decoded.

In the embodiment illustrated, control logic 240, for instance in the form of a state machine, takes as input an indication of the number of code words being output through communication channels 210-1 and 210-2. The control logic 240 counts the number of code words and outputs this number as load balancing information associated with that code word being stored in the code word buffers 205-1 . . . 205-N. Alternatively, the control logic 240 may generate load balancing information based upon a characteristic of the code words, such as a number of bits (or bytes) in each code word and output the number of bits (or bytes) of the code words for each probability as load balancing information.

In an alternate embodiment, not shown, the control logic 240 may store the load balancing information in a separate load balancing information buffer. This alternate storing embodiment may access the load balancing information buffer independent from the code word crossbar input switch 234

In an embodiment, the load balancing information may comprise header information stored with that code word in the associated code word buffer 205-1 . . . 205-N. In this embodiment, the DMA module 250 may, for instance, assemble the bitstream by collecting the code words and associated probability and load balancing information from each code word buffer 205-1 . . . 205-N.

In an alternate embodiment, the load balancing information may be stored in a separate load balancing information buffer with pointer information to the associated code word or work package. In the alternate embodiment, the DMA module 250 may, for instance, assemble the bitstream by collecting the code words and probability information from the code word buffers 205-1 . . . 205-N and combining each code word and probability information with its associated load balancing information stored in the load balancing information buffer.

A downstream component, such as DMA module 250, may be used to generate a bitstream from the collected code words.

In embodiments where one or more encoding elements 206-1 . . . 206-d service the same associated probability, the code word output controller and buffer 207 is preferably further operative to distribute the output bits corresponding to the same associated probability from each of the one or more encoding elements 206-1 . . . 206-d to the same code word buffer 205-1 . . . 205-N to collect the bits to assemble the code word. While it is possible to include additional buffers, it is preferable to assemble the code word bits processed by different encoding elements 206-1 . . . 206-d soon after the encoding process to simplify control and management of the data.

Figure 7:
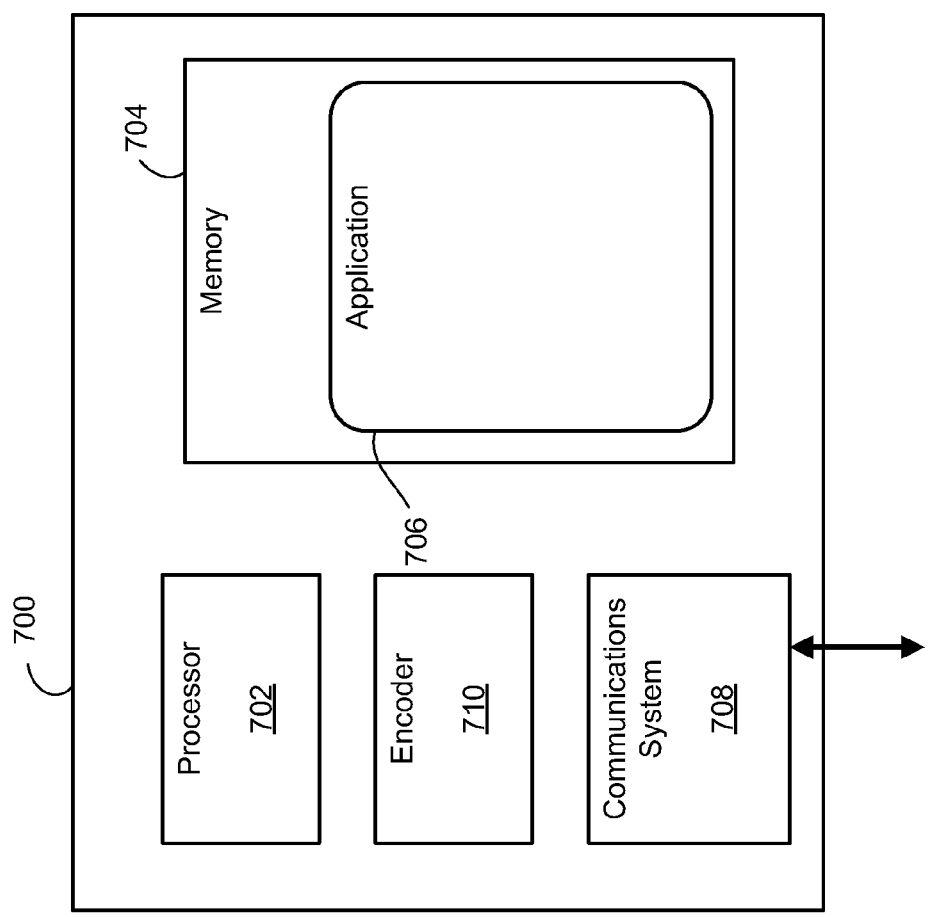
FIG. 7 shows, in block diagram form, a computing device including an encoder.

FIG. 7 is an embodiment of a computing device 700 including an encoder 710 for encoding data as described above. The computing device 700 further includes a processor 702 and memory 704, for execution of program code on the device 700 as well as management of the encoder 710, and preferably a communications system 708. In an embodiment device 700 may further comprise an in input interface such as an RCA jack, microphone or digital input, such as a digital camera, for inputting data content to be encoded and an output interface such as a screen, speaker or headphone jack for outputting content to a user of the device 700. In the embodiment illustrated an application 706 is resident in the memory 704, for instance for controlling the encoder 710.

Figure 8:
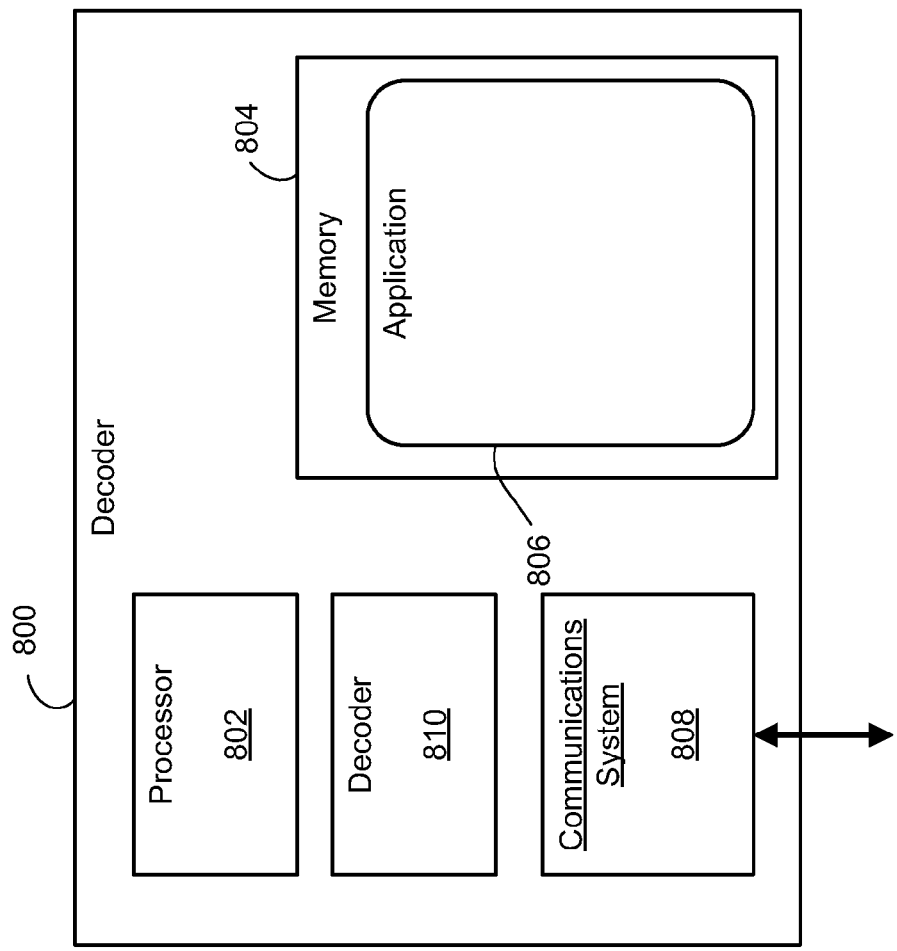
FIG. 8 shows, in block diagram form, a computing device including a decoder; and, FIG. 9 shows, in block diagram form, a computing device including an encoder and a decoder.

FIG. 8 is an embodiment of a computing device 800 including a decoder 810 for decoding data as described above. The computing device 800 further includes a processor 802 and memory 804, for execution of program code on the device 800 as well as management of the encoder 810, and preferably a communications system 808. In an embodiment device 800 may further comprise an in input interface such as an RCA jack, microphone or digital input, such as a digital camera, for inputting data content and an output interface such as a screen, speaker or headphone jack for outputting decoded content to a user of the device 800. In the embodiment illustrated an application 806 is resident in the memory 804, for instance for controlling the encoder 810.

Figure 9:
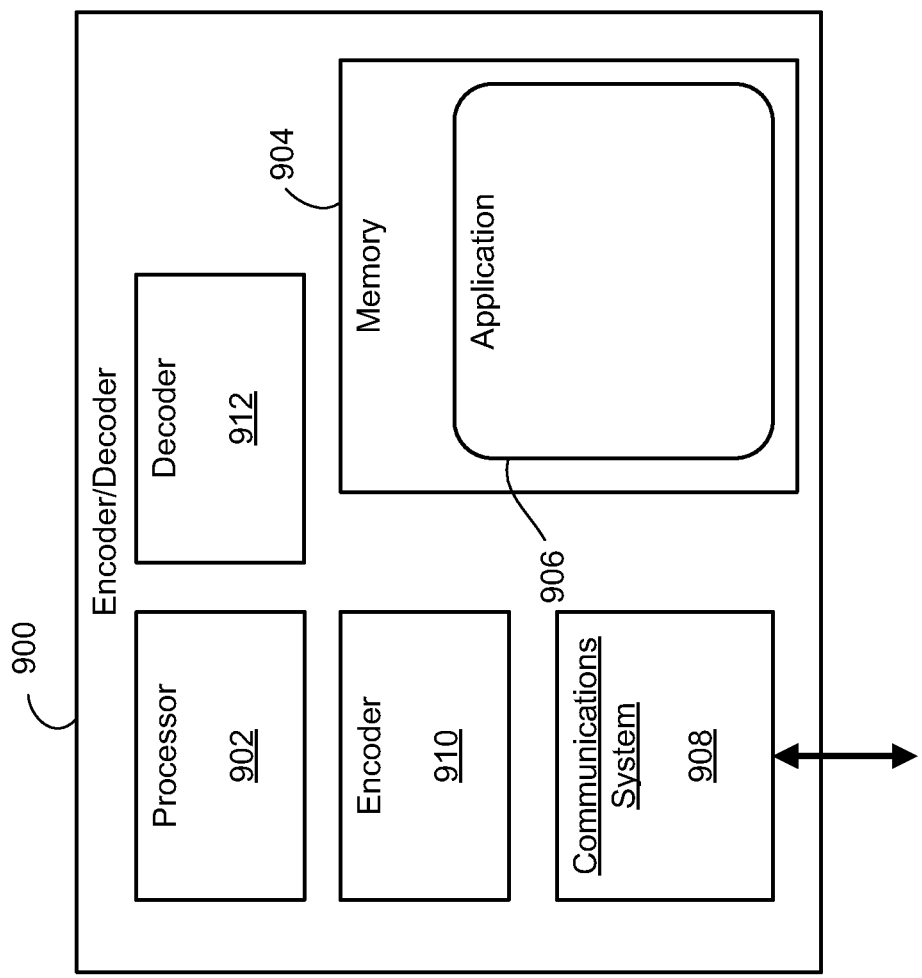

FIG. 9 is an embodiment of a computing device 900 including both an encoder 910 and a decoder 912. The computing device 900 further includes a processor 902 and memory 904, for execution of program code on the device 900 as well as management of the encoder 910, and preferably a communications system 908. In an embodiment device 900 may further comprise an in input interface such as an RCA jack, microphone or digital input, such as a digital camera, for inputting data content to be encoded and an output interface such as a screen, speaker or headphone jack for outputting decoded content to a user of the device 900. In the embodiment illustrated an application 906 is resident in the memory 904, for instance for controlling the encoder 910.

Accordingly in an embodiment such as FIG. 9, a computing device may be provided for video conferencing including an entropy encoder and an entropy decoder as described above. The entropy encoder and entropy decoder allowing for efficient real time compression and decompression of live audio and video.

FIG. 10a is an expanded view of an alternate embodiment of encoder block 200 from FIG. 5a. In the embodiment of FIG. 10a, encoder block 200 comprises a shared encoding search tree lookup table $LUT_E$ 232 and encoding elements 206-1 206-2. Encoding elements 206-1 206-2 each comprise an encoder input buffer 214-1 214-2, entropy encoder 220-1 220-2, encoder state machine 218-1 218-2 and output buffer 224-1 224-2. Entropy encoder 220-1 220-2 comprises an encoding engine 223-1 223-2 and may each comprise a subset of the encoding search tree lookup tables $LUT_E$ 222-1 222-2. The encoding search tree lookup tables $LUT_E$ 222-1 222-2 each comprising at least one search tree associated with one of the associated N probabilities. The use of both a shared encoding search tree lookup table $LUT_E$ 232 and encoding search tree lookup tables $LUT_E$ 222-1 222-2 for each encoder 220-1 220-2 is optional.

The shared encoding search tree lookup table $LUT_E$ 232 is connected to the encoding elements 206-1 206-2 by an input encoding crossbar switch 230 for receiving input and an output encoding crossbar switch 231 for providing lookup table values to the encoding elements 206-1 206-1.

The encoder state machine 218-1 218-2 is operative to direct the input buffer 214-1 214-2 to transfer phrase bits to the encoder 220-1 220-2 for encoding when the output buffer 224-1 224-2 is available. The encoder state machine 218-1 218-2 is further operative to direct the encoder 220-1 220-2 to select a table from the encoding search tree lookup tables available to that entropy encoder 220-1 220-2, the table corresponding to the probability associated with the phrase word to be encoded. In an embodiment the indication of the probability may be communicated to the encoding element 206-1 206-2 and stored in the input buffer 214-1 214-2 along with the phrase word.

Where the selected table belongs to the set of shared encoding search tree lookup tables $LUT_E$ 232, the encoding element 206-1 206-2 may access the selected table through the input encoder crossbar switch 230.

Encoding engine 223 operates on the phrase bits by traversing the selected table to generate an output code word. Upon generating the output code word, the encoder 220 transfers the code word to a code word output buffer 224. When a downstream processing block transfers the code word from the code word output buffer 224, the encoder state machine 218 selects the next phrase stored in encoder input buffer 214-1 for encoding.

Figure 10B:
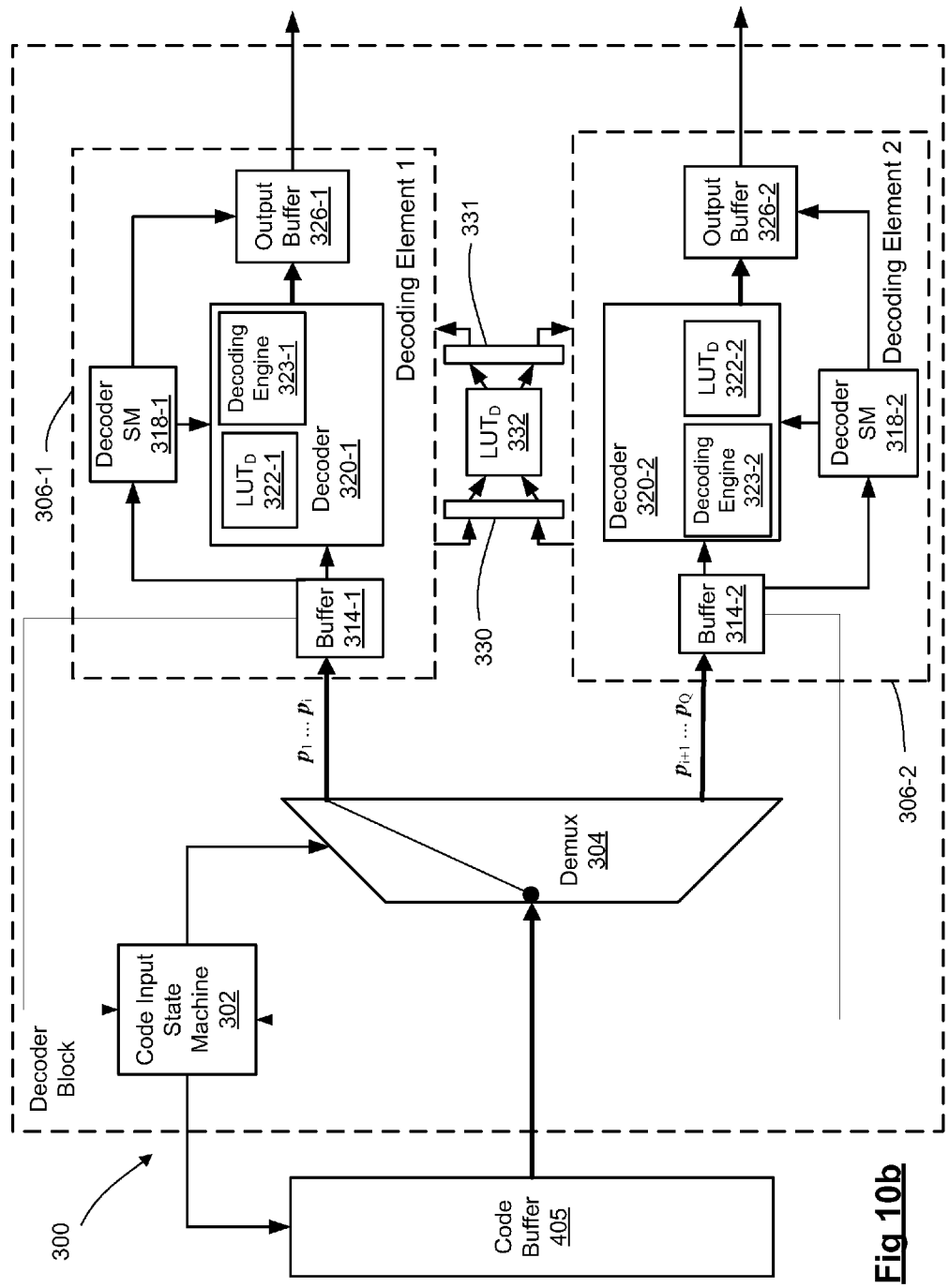
FIG. 10b shows, in block diagram form, an embodiment of an entropy decoder.

FIG. 10b is an expanded view of decoder block 300 from FIG. 2b. In the embodiment of FIG. 10b, the decoder block 300 comprises a code input state machine 302, a demultiplexer 304, shared decoding search tree lookup tables $LUT_D$ 332 and decoding elements 306-1 306-2. The decoding elements 306-1306-2 each comprise a decoder input buffer 314-1 314-2 in communication with a decoder state machine 318-1 318-2 and an entropy decoder 320-1 320-2. The decoder state machine 318-1 318-2 in communication with the decoder input buffer 314-1 314-2, the decoder 320-1 320-2 and an output buffer 326-1 326-2.

The decoder state machine 318-1 318-2 operative to read from the decoder input buffer 314-1 314-2 an indication of the probability associated with the code word in the decoder input buffer 314-1 314-2, and operative to direct the decoder 320-1 320-2 to select a decoding search tree lookup table 322-1 . . . 322-i corresponding to the probability associated with the code word.

The decoder 320-1 320-2 comprising an entropy decoding engine 323-2 323-2 a connection to the shared decoding search tree lookup tables $LUT_D$ 332 and, in an embodiment, a subset of the decoding search tree lookup tables $LUT_D$ 322-1 322-2 available to that entropy decoding engine 323-1 323-2. The decoding search tree lookup tables $LUT_D$ 322-1 322-2 each corresponding to one of the associated probabilities serviced by the decoding element 306-1 306-2. The decoding search tree lookup tables $LUT_D$322-1 . . . 322-i each comprising a search tree associated with an associated probability.

The use of both a shared decoding search tree lookup table $LUT_D$ 332 and decoding search tree lookup tables $LUT_D$ 322-1 322-2 for each decoder 320-1 320-2 is optional. Preferably, repetition of lookup tables between the decoding search tree lookup tables $LUT_D$ 322-1 322-2 is minimized, relying upon the shared decoding search tree lookup table $LUT_D$ 332 for tables to be commonly accessed by different decoders 320-1 320-2. It may, however, be desired to include multiple copies of a table, for the situation where it is likely that multiple decoders 320-1 320-2 will be operating using the same lookup table at the same time.

The shared decoding search tree lookup tables $LUT_D$ 332 is connected to the decoding elements 306-1 306-2 by an input decoding crossbar switch 330 for receiving input and an output decoding crossbar switch 331 for providing lookup table values to the decoding elements 306-1 306-2.

The decoder state machine 318-1 318-2 is operative to direct the input buffer 314-1 314-2 to transfer code bits to the decoder 320-1 320-2 for decoding when the output buffer 324-1 324-2 is available. The decoder state machine 318-1 318-2 is further operative to direct the decoder 320-1 320-2 to select a table from the decoding search tree lookup tables available to that entropy decoder 320-1 320-2, the table corresponding to the probability associated with the code word to be decoded. In an embodiment the indication of the probability may be communicated to the decoding element 306-1 306-2 and stored in the input buffer 314-1 314-2 along with the code word.

Where the selected table belongs to the set of shared encoding search tree lookup tables $LUT_D$ 332, the decoding element 306-1 306-2 may access the selected table through the input crossbar switch 230.

The decoder state machine 318-1 318-2 further operative to distribute output bits from the decoder 320-1 320-2 to decoder output buffer 326-1 326-3.

Decoding engine 323-1 323-2 operates on the code bits by traversing the selected decoding search tree lookup table to locate the leaf node contents. The leaf node contents comprising a portion, or a compressed portion, of the phrase being decoded from the input code word. Upon generating the leaf node contents, the decoder 320-1 320-2 transfers the leaf node contents to the decoder output buffer 326-1 326-2.

The leaf node contents may be collected, assembled and decompressed in a downstream processing component to re-create the phrase word.

Selection of probability trees and distribution of the probability trees across the encoding elements 206-1 . . . 206-*d* or the decoding elements 306-1 . . . 306-*d* may be optimized for a particular implementation.

In general, the smaller the physical footprint of the components and the smaller the gate count, the faster the component. In an ideal parallel design each processing element will receive the same amount of data that takes the same amount of processing time to ensure that all processing elements are operating. In selecting the search trees, it is simplest to optimize the process if all trees are roughly equally probable and all trees are roughly the same size. This allows for a simple equal distribution of trees among the encoding elements 206-1 . . . 206-*d* or the decoding elements 306-1 . . . 306-*d* and allows each element to operate on its own subset of locally stored lookup tables.

In the case where some probabilities are much more likely than others, one processing element could end up doing most of the calculations, leaving the other processing units idle waiting for a low probability code word/phrase word. To improve the performance of the system, if it is not possible to 'tune' the trees to roughly match their probabilities and size, it is possible to distribute the trees across the encoding elements 206-1 . . . 206-*d*, decoding elements 306-1 . . . 306-*d* and shared lookup tables 232 332 such that the sum of the probabilities serviced by each encoding element 206-1 . . . 206-*d* or decoding element 306-1 . . . 306-*d* is approximately equal. An additional factor is the size of the trees (lookup tables) which could have an effect on the speed if, for instance, one element 206-1 . . . 206-*d* or decoding element 306-1 . . . 306-*d* contained all of the large trees such that it ran slower than the other elements.

Including all available lookup tables in all of the encoding elements 206-1 . . . 206-*d* or decoding elements 306-1 . . . 306-*d* is not the optimal choice, as it is preferred to minimize the number of encoding/decoding search tree lookup tables 222 322. Minimizing the number of lookup tables 222-322 reduces the physical size of each encoder 220 or decoder 320, which reduces the latency time of the hardware.

The embodiments described above allows for multiple encoding/decoding elements 206-1 . . . 206-*d*/306-1 . . . 306-*d* to be available for processing a given phrase/code word, without the performance and cost penalty of including a complete duplicate set of lookup tables for each of the encoding/decoding elements 206-1 . . . 206-*d*/306-1 . . . 306-*d*.

In an embodiment, all trees are available to all encoding elements 206-1 . . . 206-*d* or decoding elements 306-1 . . . 306-*d*. This allows for all elements to operate on any phrase word or code word. In general, it is desirable to make as many tables as possible available to multiple encoding/decoding elements 206-1 . . . 206-*d*/306-1 . . . 306-*d* to ensure that an element is available to carry out the processing of each phrase/code word. The cost of placing all tables in the shared lookup tables 232 332 is the cost of the input cross bar and output cross bar that must accommodate multiple ending/decoding elements 206-1 . . . 206-*d*/306-1 . . . 306-*d* accessing multiple tables.

Depending upon the probability of each table, it may be helpful to allocate some tables to specific encoding/decoding elements 206-1 . . . 206-*d*/306-1 . . . 306-*d*. In general, it is likely to be more efficient to allocate the most probable lookup tables and the least probable lookup tables to specific encoding/decoding elements 206-1 . . . 206-*d*/306-1 . . . 306-*d*, and reserve the shared lookup tables 232 332 for the intermediate probable trees to allow flexibility in assigning an encoding/decoding element 206-1 . . . 206-*d*/306-1 . . . 306-*d* based upon availability at the time.

In an alternate embodiment, the availability of some trees is limited to individual encoding elements 206-1 . . . 206-*d* or decoding elements 306-1 . . . 306-*d* and only some of the trees are available to multiple encoding elements 206-1 . . . 206-*d* or decoding elements 306-1 . . . 306-*d*.

In order to determine the appropriate allocation of lookup tables to the encoding/decoding elements 206-1 . . . 206-*d*/306-1 . . . 306-*d*, it is necessary to assess the requirements of the encoder/decoder 200/300, along with the characteristics of the set of N search trees being implemented by that encoder/decoder 200/300. While it is desirable to select trees having a similar depth and a similar probability, in practice there may be variation in the probability of each of the trees and the depth between trees. Since deeper trees require additional steps to reach a decision or answer, deeper trees require more processing than shallow trees.

Trees should be allocated to one of three categories and each tree assigned to one or more encoding/decoding elements 206-1 . . . 206-*d*/306-1 . . . 306-*d*. The three tree allocation categories are: dedicated (static allocation); shared (dynamic allocation); and, duplicated (may be static or dynamic or both). There are two competing goals for assessing a particular tree allocation: cost (power usage and silicon area); and, performance (maximum throughput through the decoder). The performance of the encoder/decoder is dependent upon the maximum clock rate that the design can tolerate, as well as how evenly the loads are balanced across the encoding/decoding engines 232/323.

Load balancing is dependent upon the tree characteristics, the allocation of the trees, as well as the characteristics of the bitstream being encoded/decoded. Ideally, the encoder/decoder design performance is insensitive to the characteristics of the input bitstream, though practically the performance will be dependent upon the characteristics of the input bitstream to some extent. Tree allocation reduces cost while maintaining performance by minimizing the number of lookup tables and connections between components while providing a design that allows for the processing loads on all encoding/decoding engines 232/323 to be approximately equal (balanced). The goal is to minimize the times when one or more encoding/decoding elements 206-1 . . . 206-*d*/306-1 . . . 306-*d* are idle, waiting for input while another encoding/decoding element 206-1 . . . 206-*d*/306-1 . . . 306-*d* is working as the idle encoding/decoding elements 206-1 . . . 206-*d*/306-1 . . . 306-*d* do not have the appropriate lookup table available for processing the current phrase/code words.

The following steps are provided for designing a parallel encoder/decoder 200/300 with dynamic load balancing:

i. Obtain throughput target, including the target clock rate for the encoder/decoder block 200/300 (target performance); power budget; and, area budget;

ii. Analyze a variety of input bitstreams to evaluate how the probability trees are assigned by the context modeler (average and standard deviation of tree usage) over both the entire bitstream as well as small portions of the bitstream;

iii. Identify periods of distinct probability tree usage patterns (for instance, periods where small subsets of the probability trees are assigned exclusively or periods where large sets of trees assigned roughly evenly);

iv. Simulate the operation of an encoder/decoder block 200/300 with a single encoder/decoder (d=1) having all trees available and assess whether the single encoder/decoder (d=1) meets the throughput target, if not continue below;

v. Increase the number of encoding/decoding elements by 1 (d=d+1) and simulate the operation of the encoder/decoder block 200/300 under multiple scenarios varying the number of dedicated, shared and duplicated trees to assess whether the encoder/decoder meets the throughput target, if not repeat step v.;

vi. Evaluate the encoder/decoder design that meets the throughput target to assess the practical cost of the input and output crossbars using RTL code for each scenario of M shared lookup tables (write RTL for a d×M input crossbar switch and a M×d output crossbar switch to assess the performance cost of each of the scenarios); and, vii. Balance the performance function from v. with the cost function from vi. to identify a design that achieves the highest performance across the widest range of input bitstreams within the cost budget.

In evaluating an encoder/decoder/design, the RTL code provides timing and area estimates for a particular design. Running simulations with sample input bitstreams provides an estimated power consumption of the input and output crossbar switches for each value of M shared lookup tables. Similar criteria may be used to determine the optimum number of encoding elements 206-1 . . . 206-$d$ or decoding elements 306-1 . . . 306-$d$, including the clock speed of the silicon in order to meet the timing requirements of the encoder block 200 or decoder block 300.

While use of shared lookup tables 232 332 makes more lookup tables available to multiple encoding/decoding elements without duplicating tables, increasing the size of the input/output crossbar switches 230 330/231 331 to accommodate more shared tables (M) or more encoding/decoding elements (d) increases the performance and power cost of the crossbar switches.

Accordingly, generally the performance is maximized and the cost is minimized with the fewest dynamically allocated trees to meet the throughput target. The number of dynamically allocated trees may need to be higher than the absolute minimum to meet the throughput target for all anticipated input bit streams.

Certain adaptations and modifications of the described embodiments can be made. Therefore, the above discussed embodiments are considered to be illustrative and not restrictive.

What is claimed is:

1. An entropy encoder block for use in a context adaptive encoder, the entropy encoder block for encoding phrase words into code words using encoding search tree lookup tables, each encoding search tree lookup table corresponding to one of N encoding probabilities used by a context modeling component of the context adaptive encoder, the entropy encoder block receiving phrase words and an associated probability corresponding to one of the N probabilities for each phrase word, the entropy encoder block comprising:

a plurality of encoding elements for receiving phrase words and an indication of the associated probability for each phrase word, the plurality of encoding elements each connected to and operative to access a subset of one or more of the encoding search tree lookup tables to select a corresponding encoding search tree lookup table associated with each probability, such that each of the N encoding probabilities are serviced by at least one of the plurality of encoding elements and at least one of the N encoding probabilities is serviced by two or more encoding elements, and to encode the received phrase words using the selected encoding search tree lookup table to generate output code words; and, a state machine for assigning the phrase words to a particular encoding element based upon the encoding search tree lookup tables connected to that encoding element and an availability of that encoding element.

2. The encoder block of claim 1 wherein the two or more encoding elements are either each connected to their own copy of an encoding search tree lookup table, or all connected to a set of one or more shared encoding search tree lookup tables, to service the at least one of the N encoding probabilities.

3. The encoder block of claim 2 wherein the set of one or more shared encoding search tree lookup tables further comprises:

an input encoding crossbar switch connected to the two or more encoding elements and the set of one or more shared encoding search tree lookup tables, the input encoding crossbar switch operative to enable a selecting one of the two or more encoding elements to select a different shared encoding search tree lookup table from the set of one or more shared encoding search tree lookup tables; and, an output encoding crossbar switch connected to the set of one or more shared search tree lookup tables and the two or more encoding elements, the output encoding crossbar switch operative to communicate values from the selected shared encoding search tree lookup table to the corresponding selecting one of the two or more encoding elements.

4. The entropy encoder block of claim 1, further comprising control logic for evaluating the code words generated by the plurality of encoding elements and outputting load balancing information associated with the code words.

5. The encoder block of claim 4 wherein the control logic comprises a counter and the load balancing information comprises a count of a number of code words associated with each probability.

6. The encoder block of claim 4 wherein the control logic is operative to evaluate the code words and divide the code words into work packages, such that the work packages each require approximately equivalent processing to decode or, each contain approximately the same number of code words.

7. The encoder block of claim 6 wherein the control logic is further operative to generate pointers to identify each work package and package the pointers in a header attached to a group of work packages.

8. The encoder block of claim 6 wherein each work package comprises code words of the same associated probability.

9. The encoder block of claim 6 wherein at least one work package comprises code words of differing associated probabilities.

10. The encoder block of claim 9 wherein the differing associated probabilities within at least one work package are selected from a list maintained by the encoder block that identifies a group of associated probabilities serviceable by a single decoding element of a plurality of parallel decoding elements.

11. The encoder block of claim 4 wherein the load balancing information comprises: a pointer identifying the start of each code word within a collection of code words; or, a code word identifier inserted between groups of code words.

12. The encoder block of claim 1 wherein the state machine is further operative to use load balancing information to assign the phrase words and the associated probability to a particular encoding element based upon the encoding search tree lookup tables connected to that encoding element and an availability of that encoding element.

13. The entropy encoder block of claim 12 wherein the load balancing information comprises either:

a list of encoding elements able to service each probability, and the state machine is further operative to match each of the phrase words with the first available encoding element from the list corresponding to that phrase word's associated probability; or, for each probability, a likelihood of occurrence for that probability, and the state machine is further operative to assign the phrase words to available encoding elements in a decreasing order of likelihood.

14. The entropy encoder block of claim 13 wherein the likelihood for each probability further comprises identification of encoding elements able to service that probability, and the state machine is further operative to assign each phrase word to a one of the available encoding elements.

15. An entropy decoder block for use in a context adaptive decoder, the entropy decoder block for decoding code words into phrase words using decoding search tree lookup tables, each decoding search tree lookup table corresponding to one of N encoding probabilities used by a context modeling component of the context adaptive decoder, the entropy decoder block receiving code words and, for each code word, an associated probability corresponding to one of the N probabilities, the entropy decoder block comprising:
- a plurality of decoding elements for receiving, code words and an indication of the associated probability for each code word, the plurality of decoding elements each connected to and operative to access a subset of one or more of the decoding search tree lookup tables such that each of the N decoding probabilities are serviced by at least one of the plurality of decoding elements and at least one of the N decoding probabilities is serviced by two or more decoding elements, and to decode the received code words using the accessed decoding search tree lookup table; and,
- a state machine for assigning each code word and the respective indication of the associated probability for that code word to a particular decoding element based upon the decoding search tree lookup tables connected to that decoding element and an availability of that decoding element.

16. The decoder block of claim 15 wherein the two or more decoding elements are either each connected to their own copy of a decoding search tree lookup table, or all connected to a set of one or more shared decoding search tree lookup tables, to service the at least one of the N encoding probabilities.

17. The decoder block of claim 16 wherein the set of shared decoding search tree lookup tables further comprises:
- an input decoding crossbar switch connected to the two or more decoding elements and the set of one or more shared decoding search tree lookup tables, the input decoding crossbar switch operative to enable a selecting one of the two or more decoding elements to select a different shared decoding search tree lookup table from the set of one or more shared decoding search tree lookup tables; and,
- an output decoding crossbar switch connected to the set of one or more shared search tree lookup tables and the two or more decoding elements, the output decoding crossbar switch operative to communicate values from the selected shared decoding search tree lookup tables to the corresponding selecting one of the two or more decoding elements.

18. The entropy decoder block of claim 15 wherein the state machine is operative to assign the code words and the respective indication of the associated probability for each code word using load balancing information to a particular decoding element based upon the decoding search tree lookup tables connected to that decoding element and an availability of that decoding element.

19. The decoder block of claim 18 wherein the load balancing information comprises, for each code word, a likelihood of the associated probability and the state machine is further operative to assign the code words to available encoding elements in decreasing order of likelihood of the associated probability for each code word.

20. The decoder block of claim 18 wherein the state machine is further operative to generate the load balancing information.

21. The decoder block of claim 20 wherein the state machine is further operative to generate the load balancing information as an estimate of the processing required to process each code word and to assign that code word to an available decoding element able to service the associated probability based upon that estimate.

22. The decoder block of claim 21 wherein the decoder block is further operative to compute the estimate from a number of code words associated with each probability.

23. The decoder block of claim 21 wherein the estimate comprises a number of code words associated with each probability and the state machine is further operative to assign code words of each probability to decoding elements in decreasing order of the number of code words associated with that probability.

24. The encoder block of claim 18 wherein the state machine is operative to receive the load balancing information.

25. The decoder block of claim 24 wherein the load balancing information comprises work package identifiers received with the code words and associated probabilities, the work package identifiers dividing the received code words into groups of code words, each group requiring approximately equal processing work by a decoding element to decode or comprising a same number of code words, and the control logic is further operative to distribute the work packages to the decoding elements.

26. The decoder block of claim 25 wherein the identifiers comprise pointers to identify the beginning of each work package, and the control logic is operative to access a code word buffer using the pointers to locate each work package.

* * * * *